(12) United States Patent
Shimizu et al.

(10) Patent No.: US 8,050,637 B2
(45) Date of Patent: Nov. 1, 2011

(54) POLAR MODULATION TRANSMITTER, ADAPTIVE DISTORTION COMPENSATION PROCESSING SYSTEM, POLAR MODULATION TRANSMISSION METHOD, AND ADAPTIVE DISTORTION COMPENSATION PROCESSING METHOD

(75) Inventors: Yoshito Shimizu, Kanagawa (JP); Tomoya Urushihara, Chiba (JP)

(73) Assignee: Panasonic Corporation, Osaka (JP)

( * ) Notice: Subject to any disclaimer, the term of this patent is extended or adjusted under 35 U.S.C. 154(b) by 796 days.

(21) Appl. No.: 12/159,469

(22) PCT Filed: Dec. 26, 2006

(86) PCT No.: PCT/JP2006/325959
§ 371 (c)(1),
(2), (4) Date: Jun. 27, 2008

(87) PCT Pub. No.: WO2007/077838
PCT Pub. Date: Jul. 12, 2007

(65) Prior Publication Data
US 2010/0222015 A1  Sep. 2, 2010

(30) Foreign Application Priority Data

Dec. 27, 2005  (JP) ................................. 2005-375486

(51) Int. Cl.
*H04B 1/02* (2006.01)
(52) U.S. Cl. ..................... 455/114.3; 455/126
(58) Field of Classification Search .................. 455/102, 455/108, 115.1, 114.2, 114.3, 126
See application file for complete search history.

(56) References Cited

U.S. PATENT DOCUMENTS

| 5,870,668 | A | * | 2/1999 | Takano et al. | ................. 455/126 |
| 6,809,588 | B2 | | 10/2004 | Takada et al. | |
| 6,928,272 | B2 | * | 8/2005 | Doi | ........................... 455/114.2 |
| 7,263,135 | B2 | | 8/2007 | Takabayashi et al. | |
| 7,383,028 | B2 | | 6/2008 | Suzuki et al. | |

(Continued)

FOREIGN PATENT DOCUMENTS

JP  2002-514028 A  5/2002

(Continued)

OTHER PUBLICATIONS

International Search Report.

(Continued)

*Primary Examiner* — Blane J Jackson
(74) *Attorney, Agent, or Firm* — Pearne & Gordon LLP

(57) ABSTRACT

An object of the invention is to provide a polar modulation transmitter that can perform adaptive distortion compensation processing without the need for a synchronization adjustment circuit for synchronizing an input baseband signal and an output signal of a power amplifier. An adaptive operation control section 1501 measures the unbalance amount of an output spectrum of a power amplifier 1 and a coefficient adjustment determination section of the adaptive operation control section 1501 performs iteration control so that if the unbalance amount is equal to or greater than a predetermined threshold value, coefficient information output to a distortion compensation processing circuit 1301 is adjusted and an adjustment is made to distortion compensation processing in the distortion compensation processing circuit 1301 and if the unbalance amount is less than the predetermined threshold value, the coefficient information is maintained, whereby the characteristic change of the power amplifier 1 at the environmental temperature change time can be adaptively compensated for without using a synchronization adjustment circuit for synchronizing an input baseband signal and an output signal from the power amplifier 1.

35 Claims, 20 Drawing Sheets

U.S. PATENT DOCUMENTS

| | | | |
|---|---|---|---|
| 7,551,686 B1 * | 6/2009 | Coons et al. | 375/296 |
| 7,817,970 B2 * | 10/2010 | Puma | 455/114.3 |
| 7,962,108 B1 * | 6/2011 | Khlat et al. | 455/114.3 |
| 2003/0085762 A1 | 5/2003 | Takada et al. | |
| 2005/0079835 A1 | 4/2005 | Takabayashi et al. | |
| 2005/0153669 A1 | 7/2005 | Suzuki et al. | |
| 2007/0190952 A1 * | 8/2007 | Waheed et al. | 455/114.3 |

FOREIGN PATENT DOCUMENTS

| | | |
|---|---|---|
| JP | 2003-110371 A | 4/2003 |
| JP | 2003-258560 A | 9/2003 |
| JP | 2004-501527 A | 1/2004 |
| JP | 2004-356835 A | 12/2004 |
| JP | 2005-203960 A | 7/2005 |
| JP | 2005-269440 A | 9/2005 |
| WO | 2006-001433 A1 | 1/2006 |

OTHER PUBLICATIONS

Kenington, Peter B. "Tekiigh-LinearityRF Amplifier Design" baiAArtech House Publishers.

Suzuki, M., Yamawaki, T., Tanoue, T., Ookuma, Y., Fujiwara, R., Tanaka, S.; "Proposal of Transmitter Architecture for Mobile Terminals Employing EER Power Amplifier", IEEE, 2003, pp. 1327-1330.

* cited by examiner

| ADDRESS | coeff1 |
|---|---|
| 1 | $C_1$ |
| 2 | $C_2$ |
| 3 | $C_3$ |
| 4 | $C_4$ |
| ⋮ | ⋮ |
| N | $C_N$ |

| OUTPUT POWER | $D_1$ |
|---|---|
| 33 | 1 |
| 31 | 2 |
| 29 | 3 |
| 27 | 4 |
| ⋮ | ⋮ |
| 5 | 15 | span : 2MHz

FIG. 17

| ADDRESS | coeff6 |
|---|---|
| 1 | $C_{171}$ |
| 2 | $C_{172}$ |
| 3 | $C_{173}$ |
| Q | 1 |
| ⋮ | ⋮ |
| P | $C_{17P}$ |

FIG. 21

| ADDRESS | coeff7 |
|---|---|
| 1 | $C_{211}$ |
| 2 | $C_{212}$ |
| 3 | 1 |
| 4 | $C_{214}$ |
| 5 | $C_{215}$ |
| ⋮ | ⋮ |

FIG. 22

| MODULATION SPEED | $D_7$ |
|---|---|
| ~100k | 1 |
| ~200k | 2 |
| ~400k | 3 |
| ~800k | 4 |
| ~1.6M | 5 |
| ⋮ | ⋮ |

POLAR MODULATION TRANSMITTER, ADAPTIVE DISTORTION COMPENSATION PROCESSING SYSTEM, POLAR MODULATION TRANSMISSION METHOD, AND ADAPTIVE DISTORTION COMPENSATION PROCESSING METHOD

TECHNICAL FIELD

This invention relates to a polar modulation transmitter containing a distortion compensation processing circuit for compensating for distortion of an output signal of an amplifier and an adaptive distortion compensation processing system using the polar modulation transmitter.

BACKGROUND ART

It has been important to improve the communication speed in mobile telephone service in recent years because of an expansion of the demand for data communications in addition to voice communications. For example, in a GSM (Global System for Mobile communications) system widespread mainly in the European and Asian regions, hitherto, voice communications have been conducted with GMSK modulation for shifting the phase of a carrier wave in response to transmission data; an EDGE (Enhanced Data rates for GSM Evolution) system for also conducting data communications in $3\pi/8$ rotating 8-PSK modulation (which will be hereinafter abbreviated as 8-PSK modulation) enhancing bit information per symbol to three times relative to GMSK modulation by shifting the phase and the amplitude of a carrier wave in response to transmission data is proposed.

Requirement for linearity for a power amplifier of a wireless communication apparatus transmission section is rigid in a linear modulation system involving amplitude fluctuation like the 8-PSK modulation. Generally, the power efficiency in a linear operation area of a power amplifier is low as compared with the power efficiency in a saturation operation area. Therefore, if a conventional quadrature modulation system is applied to the linear modulation system, it is difficult to increase the power efficiency.

Then, a system of accomplishing higher efficiency of a power amplifier in the linear modulation system, called EER (Envelope Elimination & Restoration) for separating a transmission signal into a constant amplitude phase signal and an amplitude signal, executing phase modulation in a phase modulator based on the constant amplitude phase signal, inputting a constant amplitude phase modulation signal at a level at which the power amplifier becomes a saturation operation point, and driving the control voltage of the power amplifier at high speed for combining amplitude modulation is known (for example, refer to p. 427 and FIG. 7.1 of non-patent document 1). Particularly, a modulation system of separating a transmission signal in a baseband and executing modulation using provided constant amplitude phase information and amplitude information is called Polar Modulation system (polar modulating system) (for example, refer to p. 428 and FIG. 7.2 of non-patent document 1). In the description that follows, it is called polar modulation system to clarify a description of a modulation system different from the conventional quadrature modulation system.

In the polar modulation system, it is difficult at the present technological level to ensure the linearity of the output voltage amplitude relative to the input control voltage of a power amplifier for the required dynamic range for representing amplitude information in output of the power amplifier and therefore it becomes necessary to apply a distortion compensation processing technology.

FIG. 27 is a block diagram to show a polar modulation transmitter in a related art incorporating a predistortion (hereinafter, abbreviated as PD) distortion compensation processing technology described in FIG. 10 of patent document 1.

As shown in FIG. 27, a polar modulation transmitter 20 includes a power amplifier 1, a polar modulation section 2, a distortion compensation processing circuit 3, an amplitude modulation section 10, a phase modulation section 11, and an amplitude and phase measurement section 12. The distortion compensation processing circuit 3 includes delay adjustment sections 4 and 5, memory 6, an address generation section 7, an amplitude information correction section 8, and a phase information correction section 9.

Next, the operation of the polar modulation transmitter 20 in the related art shown in FIG. 27 will be discussed.

To implement a wireless communication apparatus transmission section using the polar modulation transmitter 20, the polar modulation section 2 separates a baseband orthogonal coordinate signal (IQ signal) input from a signal generation section not shown of a wireless communication apparatus into an amplitude signal r(t) and a phase signal θ(t) of a constant amplitude. Here, r(t) is normalized in a predetermined value.

The distortion compensation processing circuit 3 performs predetermined distortion compensation processing for the amplitude information r(t) and the phase information and outputs the amplitude information after subjected to the compensation θ(t) to the amplitude modulation section 10 and also outputs the phase information after subjected to the compensation to the phase modulation section 11. The configuration and the operation of the distortion compensation processing circuit 3 are described later.

The phase modulation section 11 executes phase modulation based on the phase information output from the distortion compensation processing circuit 3.

The power amplifier 1 combines amplitude modulation with a phase modulation signal output from the phase modulation section 11 based on an output signal from the amplitude modulation section 10 as a control signal.

When a predetermined input signal is given to the polar modulation section 2 and a control voltage for decreasing the output signal amplitude of the power amplifier 1 at a predetermined interval from the maximum value is supplied, the amplitude and phase measurement section 12 measures the output signal amplitude characteristic and the passage phase characteristic of the power amplifier 1 for each control voltage value and outputs acquired data to the memory 6.

Next, the configuration and the operation of the distortion compensation processing circuit 3 will be discussed in detail:

To compensate for the differential delay between the paths of the amplitude modulation signal and the phase modulation signal, the delay adjustment sections 4 and 5 give a predetermined delay to the amplitude information and the phase information output from the polar modulation section 2 and output the amplitude information after subjected to the delay adjustment to the address generation section 7 and the amplitude information correction section 8 and output the phase information after subjected to the delay adjustment to the phase information correction section 9.

The memory 6 stores the inverse characteristics of the output signal amplitude characteristic relative to the input control signal, of the power amplifier 1 at a predetermined input high-frequency signal amplitude, output from the amplitude and phase measurement section 12 (AM-AM:

Amplitude Modulation to Amplitude Modulation conversion, which will be hereinafter referred to as AM-AM characteristic) and the passage phase characteristic (AM-PM: Amplitude Modulation to Phase Modulation conversion, which will be hereinafter referred to as AM-PM characteristic), and outputs an amplitude correction signal and a phase correction signal of the inverse characteristics of the power amplifier 1 in response to an address signal output from the address generation section 7. The characteristics indicate the characteristics at the time of supplying a control voltage in a steady state.

To distinguish the AM-AM characteristic and the AM-PM characteristic of the power amplifier 1 at the time of supplying a control voltage in a steady state, the inverse characteristics thereof, and the characteristic of the power amplifier at the amplitude modulation operation time from each other, hereinafter the characteristic of the power amplifier 1 acquired using a measurement section such as the amplitude and phase measurement section 12 will be referred to as forward characteristic (AM-AM forward characteristic, AM-PM forward characteristic), compensation data stored in distortion compensation processing memory such as the memory 6 will be referred to as inverse characteristic (AM-AM inverse characteristic, AM-PM inverse characteristic), and the characteristic of the power amplifier 1 at the amplitude modulation operation time will be referred to as dynamic characteristic (AM-AM dynamic characteristic, AM-PM dynamic characteristic).

The address generation section 7 converts the amplitude information output from the delay adjustment section 4 into a discrete value in a predetermined range and having a predetermined step width found from the compensation data stored in the memory 6 and the compensation accuracy and then generates an address signal to reference the compensation data stored in the memory 6.

The amplitude information correction section 8 makes a correction to the amplitude information output from the delay adjustment section 4 based on the amplitude correction signal output from the memory 6.

The phase information correction section 9 makes a correction to the phase information output from the delay adjustment section 5 based on the phase correction signal output from the memory 6.

Thus, the amplitude modulation signal and the phase modulation signal previously distorted considering the inverse characteristic of the output characteristic of the power amplifier relative to the input control signal receive the effects of the actual amplitude distortion and phase distortion occurring in the power amplifier and become any desired output amplitude and phase and the linearity relative to the input control voltage can be improved.

The description of the operation of the polar modulation transmitter in the related art described in patent document 1 is concluded. Hereinafter, the polar modulation transmitter 20 described in patent document 1 will be referred to as the polar modulation transmitter in the related art.

Subsequently, an art required for implementing a wireless communication apparatus transmission section using the polar modulation transmitter in the related art will be discussed.

Considering the operation environment of a wireless communication apparatus, adaptive distortion compensation processing for correcting characteristic change of a power amplifier at the environment variation time of the ambient temperature, etc., is required. The polar modulation transmitter in the related art does not assume distortion compensation processing of updating compensation data during the transmission operation and thus cannot deal with adaptive processing.

Then, there is an adaptive predistortion (hereinafter, abbreviated as APD) distortion compensation processing technology of making a comparison between a baseband transmission signal (input signal) and a signal provided by executing frequency conversion of an output signal of a power amplifier until the baseband (output signal) at a predetermined time interval and correcting an error between the input signal and the output signal according to an LMS (Least Mean Square) algorithm, etc., (for example, refer to FIG. 2 of patent document 2).

In the polar modulation system, it is necessary to ensure synchronization with an accuracy of one several tenth of symbol interval for the differential delay between the amplitude signal and the constant amplitude phase signal. In the APD distortion compensation processing technology, synchronization between the input signal and the output signal also needs to be ensured with the same level of accuracy.

Patent document 1: International Patent Publication No. 2004-501527
Patent document 2: International Patent Publication No. 2002-514028
Non-patent document 1: Kenington, Peter B, Tekiigh-LinearityRF Amplifier Design baiAArtech House Publishers Problems to be Solved by the Invention To precisely represent transmission data in an output signal of a power amplifier in the polar modulation system, it is necessary to perform distortion compensation processing considering the output response characteristic of an amplitude modulation section or the power amplifier when amplitude modulation is executed in the power amplifier.

In the polar modulation transmitter in the related art, distortion compensation data used for distortion compensation processing is the characteristic of the power amplifier relative to the control voltage in a steady state and therefore the distortion compensation accuracy is degraded due to the output response characteristic at the amplitude modulation operation time, at the modulation speed switching time, etc.

If large-capacity compensation data is used to compensate for the output response characteristic, the circuit scale increases and a problem of an increase in the manufacturing cost occurs.

Therefore, it is a first problem to realize low distortion characteristic of the power amplifier at the amplitude modulation operation time while suppressing an increase in the distortion compensation processing data capacity and an increase in the circuit scale of the distortion compensation processing circuit.

A problem occurring in implementing a wireless communication apparatus transmission section using the polar modulation transmitter in the related art will be discussed.

Considering the actual operation environment of a wireless communication apparatus, adaptive distortion compensation processing for correcting characteristic change of a power amplifier at the environment variation time of the ambient temperature, etc., needs to be performed and can be realized by applying the known APD distortion compensation processing technology to the polar modulation transmitter in the related art.

However, if the known APD distortion compensation processing technology is applied to the polar modulation transmitter in the related art, the synchronization accuracy for the differential delay between the amplitude signal and the constant amplitude phase signal in the polar modulation system and the synchronization accuracy for the differential delay between the input signal and the output signal in the APD distortion compensation processing technology need to be ensured with the same level of accuracy and thus the circuit scale of a synchronization adjustment circuit increases.

Therefore, it is a second problem to implement a polar modulation transmitter that can realize adaptive distortion compensation processing without increasing the circuit scale of the synchronization adjustment circuit.

The invention is embodied considering the conventional circumstances described above and it is an object of the invention to provide a polar modulation transmitter that can realize low distortion characteristic of a power amplifier at the amplitude modulation operation time while suppressing an increase in the distortion compensation processing data capacity and an increase in the circuit scale of a distortion compensation processing circuit and a polar modulation transmitter that can perform adaptive distortion compensation processing without the need for a synchronization adjustment circuit for synchronizing an input baseband signal and an output signal of the power amplifier.

Means for Solving the Problems

A polar modulation transmitter of the invention, first, includes a polar modulation section that generates an amplitude signal from a baseband orthogonal signal generated based on transmission data; an amplitude modulation section that generates an amplitude modulation signal based on the amplitude signal; a phase modulation section that generates a phase modulation signal in a wireless frequency band based on a signal having at least a phase component of the baseband orthogonal signal; an amplifier that generates transmission data in the wireless frequency band by inputting the phase modulation signal as an input high frequency signal and inputting the amplitude modulation signal as a control signal; a detection section that calculates out of band power in two frequency bands of predetermined same detuning frequencies from the center frequency of the output signal of the amplifier; and a distortion compensation processing section that includes a predistortion compensation section which stores distortion compensation processing data and executes predetermined distortion compensation processing based on the distortion compensation processing data for at least one of an input signal to the amplitude modulation section and an input signal to the phase modulation section using the amplitude signal as a reference signal and a distortion compensation adjustment section which executes a distortion adjustment to a signal output from the predistortion compensation section or the reference signal based on output of the detection section.

According to this configuration, the adaptive distortion compensation processing can be performed without the need for a synchronization adjustment circuit for synchronizing the input baseband signal and the output signal of the power amplifier.

The polar modulation transmitter of the invention, second, is the first polar modulation transmitter described above wherein the predistortion compensation section further includes a delay adjustment section which applies a predetermined delay amount to at least one of the amplitude signal and the signal having a phase component to ensure synchronization between the amplitude signal and the signal having a phase component, and wherein the distortion compensation processing section executes distortion adjustment in at least one of the distortion compensation adjustment section and the delay adjustment section based on the output of the detection section.

According to this configuration, higher-accuracy adaptive distortion compensation processing can be performed by performing synchronization adjustment between the amplitude signal and the phase signal in addition to the advantage of the first polar modulation transmitter.

The polar modulation transmitter of the invention, third, is the first or second polar modulation transmitter described above wherein the distortion compensation adjustment section controls the adjustment amount for the distortion compensation processing based on plus or minus of the difference between the relative difference of the out of band power and a predetermined threshold value.

According to this configuration, higher-accuracy adaptive distortion compensation processing can be realized in the polar modulation system in addition to the advantage of the first or second polar modulation transmitter described above.

The polar modulation transmitter of the invention, fourth, is the third polar modulation transmitter described above further includes a distortion compensation adjustment determination section that switches between execution and non-execution of the adjustment of the distortion compensation adjustment section.

According to this configuration, further high-accuracy adaptive distortion compensation processing can be realized in addition to the advantage of the third polar modulation transmitter described above.

The polar modulation transmitter of the invention, fifth, is the third or fourth polar modulation transmitter described above wherein the predistortion compensation section has a steady state characteristic compensation circuit for linearizing the output signal of the amplifier in a steady state based on the output signal characteristic for a control voltage value in the steady state after a predetermined control voltage is input when a predetermined input high frequency signal amplitude is input, and wherein the distortion compensation adjustment section has a first amplitude information adjustment section for adjusting the amplitude of the amplitude signal after execution of distortion compensation processing in the steady state characteristic compensation circuit and compensating for a transient response characteristic of the output signal from the amplifier at the control voltage driving time.

According to this configuration, further high-accuracy distortion compensation processing can be realized in the polar modulation system in addition to the advantage of the third or fourth polar modulation transmitter described above.

The polar modulation transmitter of the invention, sixth, is the fifth polar modulation transmitter described above wherein the first amplitude information adjustment section has a multiplication circuit for multiplying the amplitude of the amplitude signal after execution of the distortion compensation processing in the steady state characteristic compensation circuit by a predetermined coefficient.

According to this configuration, the configuration can be simplified in addition to the advantage of the fifth polar modulation transmitter described above.

The polar modulation transmitter of the invention, seventh, is the third or four polar modulation transmitter described above wherein the predistortion compensation section has a steady state characteristic compensation circuit for linearizing the output signal of the amplifier in a steady state based on the output signal characteristic for a control voltage value in the steady state after a predetermined control voltage is input when a predetermined input high frequency signal amplitude is input, and wherein the distortion compensation adjustment section has a second amplitude information adjustment section for adjusting the value of a reference address signal when the steady state characteristic compensation circuit executes distortion compensation processing of the amplitude signal and compensating for a transient response characteristic of the output signal from the amplifier at the control voltage driving time.

According to this configuration, further high-accuracy distortion compensation processing can be realized in the polar modulation system in addition to the advantage of the third or fourth polar modulation transmitter described above.

The polar modulation transmitter of the invention, eighth, is the seventh polar modulation transmitter described above wherein the second amplitude information adjustment section has a multiplication circuit for multiplying the value of the reference address signal when the steady state characteristic compensation circuit executes distortion compensation processing of the amplitude signal by a predetermined coefficient.

According to this configuration, the configuration can be simplified in addition to the advantage of the seventh polar modulation transmitter described above.

The polar modulation transmitter of the invention, ninth, is the third or four polar modulation transmitter described above wherein the polar modulation section generates a phase signal from the baseband orthogonal signal and outputs the phase signal to the distortion compensation processing section, wherein the predistortion compensation section performs distortion compensation processing for the phase signal and outputs the signal to the phase modulation section, wherein the predistortion compensation section has a steady state characteristic compensation circuit for linearizing the output signal of the amplifier in a steady state based on the output signal characteristic for a control voltage value in the steady state after a predetermined control voltage is input when a predetermined input high frequency signal amplitude is input, and wherein the distortion compensation adjustment section has a second amplitude information adjustment section for adjusting the value of a reference address signal when the steady state characteristic compensation circuit executes distortion compensation processing of the phase signal.

According to this configuration, further high-accuracy distortion compensation processing can be realized in the polar modulation system in addition to the advantage of the third or fourth polar modulation transmitter described above.

The polar modulation transmitter of the invention, tenth, is the ninth polar modulation transmitter described above wherein the second amplitude information adjustment section has a multiplication circuit for multiplying the value of the reference address signal when the steady state characteristic compensation circuit executes distortion compensation processing of the phase signal by a predetermined coefficient.

According to this configuration, the configuration can be simplified in addition to the advantage of the ninth polar modulation transmitter described above.

The polar modulation transmitter of the invention, eleventh, is the third or four polar modulation transmitter described above wherein the predistortion compensation section has a steady state characteristic compensation circuit for linearizing the output signal of the amplifier in a steady state based on the output signal characteristic for a control voltage value in the steady state after a predetermined control voltage is input when a predetermined input high frequency signal amplitude is input, and wherein the distortion compensation adjustment section has a phase compensation circuit for adjusting the amplitude of the signal having a phase component and adjusting the input high frequency signal amplitude to the amplifier.

According to this configuration, further high-accuracy distortion compensation processing can be realized in the polar modulation system in addition to the advantage of the third or fourth polar modulation transmitter described above.

The polar modulation transmitter of the invention, twelfth, is the eleventh polar modulation transmitter described above wherein the phase compensation circuit has a variable attenuation circuit or a variable gain amplifier provided between the phase modulation section and the amplifier.

According to this configuration, the configuration can be simplified in addition to the advantage of the eleventh polar modulation transmitter described above.

An adaptive distortion compensation processing system of the invention, first, is an adaptive distortion compensation processing system including a mobile station wireless communication apparatus having a distortion compensation processing circuit and a base station wireless communication apparatus, wherein the base station wireless communication apparatus includes a first antenna; a base station transceiver which transmits and receives data to and from the mobile station wireless communication apparatus through the first antenna; a detection section which branches a signal output from the first antenna at the reception operation time of the base station wireless communication apparatus and calculates out of band power in two frequency bands of predetermined same detuning frequencies from the center frequency of the branch signal; and a conversion section which converts relative difference information of the out of band power into transmission data from the base station transceiver to control compensation data relevant to a transmitter of the mobile station wireless communication apparatus.

According to this configuration, the loss caused by branching the output signal of the power amplifier forming a part of the mobile station wireless communication apparatus and shortening of the telephone conversion time and the data communication time of the mobile station wireless communication apparatus caused by an increase in the consumption current in the acquisition part of the ACPR characteristic can be solved.

The adaptive distortion compensation processing system of the invention, second, is the first adaptive distortion compensation processing system described above wherein the mobile station wireless communication apparatus includes a polar modulation transmitter having a polar modulation section which generates an amplitude signal from a baseband orthogonal signal generated based on transmission data; an amplitude modulation section which generates an amplitude modulation signal based on the amplitude signal; a phase modulation section which generates a phase modulation signal in a wireless frequency band based on a signal having at least a phase component of the baseband orthogonal signal and a distortion compensation processing section having an amplifier for generating transmission data in the wireless frequency band by inputting the phase modulation signal as an input high frequency signal and inputting the amplitude modulation signal as a control signal, a predistortion compensation section for storing predetermined distortion compensation processing data and performing predetermined distortion compensation processing based on the distortion compensation processing data for at least one of an input signal to the amplitude modulation section and an input signal to the phase modulation section using the amplitude signal as a reference signal, and a distortion compensation adjustment section for executing a distortion adjustment to a signal output from the predistortion compensation section or the reference signal and a second antenna, wherein the distortion compensation adjustment section reconstructs the relative difference information of the out of band power converted into the transmission signal by the conversion section from a reception signal from the second antenna and executes the distortion adjustment based on the relative difference information.

According to this configuration, the adaptive distortion compensation processing can be performed without the need for a synchronization adjustment circuit for synchronizing the input baseband signal and the output signal of the power amplifier for the mobile station wireless communication apparatus in addition to the advantage of the first adaptive distortion compensation processing system described above.

The adaptive distortion compensation processing system of the invention, third, is the first adaptive distortion compensation processing system described above wherein in the mobile station wireless communication apparatus, the predistortion compensation section further includes a delay adjustment section for giving a predetermined delay amount to at least one of the amplitude signal and the signal having a phase component and ensuring synchronization between the amplitude signal and the signal having a phase component, and the distortion compensation adjustment section reconstructs the relative difference information of the out of band power converted into the transmission signal by the conversion section from a reception signal from the second antenna and executes the adjustment in at least one of the distortion compensation adjustment section and the delay adjustment section based on the relative difference information.

According to this configuration, the adaptive distortion compensation processing can be performed without the need for a synchronization adjustment circuit for synchronizing the input baseband signal and the output signal of the power amplifier for the mobile station wireless communication apparatus and the adaptive distortion compensation processing capable of performing synchronization adjustment between the amplitude signal and the phase signal can be performed in addition to the advantage of the first adaptive distortion compensation processing system described above.

The adaptive distortion compensation processing system of the invention, fourth, is any of the first to third adaptive distortion compensation processing systems described above wherein the conversion section converts the relative difference information into code information and absolute value information converted into a discrete value at a predetermined interval.

According to this configuration, the transmission data capacity can be decreased in addition to the advantage of any of the first to third adaptive distortion compensation processing systems described above.

The adaptive distortion compensation processing system of the invention, fifth, is any of the second to fourth adaptive distortion compensation processing systems described above further including a distortion compensation adjustment determination section for switching between execution and non-execution of the adjustment of the distortion compensation adjustment section based on plus or minus of the difference between the relative difference information and a predetermined threshold value.

According to this configuration, further high-accuracy adaptive distortion compensation processing can be realized in addition to the advantage of any of the second to fourth adaptive distortion compensation processing systems described above.

The adaptive distortion compensation processing system of the invention, sixth, is any of the second to fifth adaptive distortion compensation processing systems described above wherein the predistortion compensation section has a steady state characteristic compensation circuit for linearizing the output signal of the amplifier in a steady state based on the output signal characteristic for a control voltage value in the steady state after a predetermined control voltage is input when a predetermined input high frequency signal amplitude is input, and wherein the distortion compensation adjustment section has a first amplitude information adjustment section for adjusting the amplitude of the amplitude signal after execution of distortion compensation processing in the steady state characteristic compensation circuit and compensating for a transient response characteristic of the output signal from the amplifier at the control voltage driving time.

According to this configuration, further high-accuracy distortion compensation processing can be realized in the mobile station wireless communication apparatus for transmitting in the polar modulation system in addition to the advantage of any of the second to fifth adaptive distortion compensation processing systems described above.

The adaptive distortion compensation processing system of the invention, seventh, is the sixth adaptive distortion compensation processing system described above wherein the first amplitude information adjustment section has a multiplication circuit for multiplying the amplitude of the amplitude signal after execution of the distortion compensation processing in the steady state characteristic compensation circuit by a predetermined coefficient.

According to this configuration, the configuration can be simplified in addition to the advantage of the sixth adaptive distortion compensation processing system described above.

The adaptive distortion compensation processing system of the invention, eighth, is any of the second to fifth adaptive distortion compensation processing systems described above wherein the predistortion compensation section has a steady state characteristic compensation circuit for linearizing the output signal of the amplifier in a steady state based on the output signal characteristic for a control voltage value in the steady state after a predetermined control voltage is input when a predetermined input high frequency signal amplitude is input, and wherein the distortion compensation adjustment section has a second amplitude information adjustment section for adjusting the value of a reference address signal when the steady state characteristic compensation circuit executes distortion compensation processing of the amplitude signal and compensating for a transient response characteristic of the output signal from the amplifier at the control voltage driving time.

According to this configuration, further high-accuracy distortion compensation processing can be realized in the mobile station wireless communication apparatus for transmitting in the polar modulation system in addition to the advantage of any of the second to fifth adaptive distortion compensation processing systems described above.

The adaptive distortion compensation processing system of the invention, ninth, is the eighth adaptive distortion compensation processing system described above wherein the second amplitude information adjustment section has a multiplication circuit for multiplying the value of the reference address signal when the steady state characteristic compensation circuit executes distortion compensation processing of the amplitude signal by a predetermined coefficient.

According to this configuration, the configuration can be simplified in addition to the advantage of the eighth adaptive distortion compensation processing system described above.

The adaptive distortion compensation processing system of the invention, tenth, is any of the second to fifth adaptive distortion compensation processing systems described above wherein the polar modulation section generates a phase signal from the baseband orthogonal signal and outputs the phase signal to the distortion compensation processing section, wherein the distortion compensation processing section performs distortion compensation processing for the phase signal and outputs the signal to the phase modulation section, wherein the predistortion compensation section has a steady state characteristic compensation circuit for linearizing the output signal of the amplifier in a steady state based on the output signal characteristic for a control voltage value in the steady state after a predetermined control voltage is input when a predetermined input high frequency signal amplitude is input, and wherein the distortion compensation adjustment section has a second amplitude information adjustment section for adjusting the value of a reference address signal when the steady state characteristic compensation circuit executes distortion compensation processing of the phase signal and compensating for a transient response characteristic of the output signal from the amplifier at the control voltage driving time.

According to this configuration, further high-accuracy distortion compensation processing can be realized in the mobile station wireless communication apparatus for transmitting in the polar modulation system in addition to the advantage of any of the second to fifth adaptive distortion compensation processing systems described above.

The adaptive distortion compensation processing system of the invention, eleventh, is the tenth adaptive distortion compensation processing system described above wherein the second amplitude information adjustment section has a multiplication circuit for multiplying the value of the reference address signal when the steady state characteristic compensation circuit executes distortion compensation processing of the phase signal by a predetermined coefficient.

According to this configuration, the configuration can be simplified in addition to the advantage of the tenth adaptive distortion compensation processing system described above.

The adaptive distortion compensation processing system of the invention, twelfth, is any of the second to fifth adaptive distortion compensation processing systems described above wherein the predistortion compensation section has a steady state characteristic compensation circuit for linearizing the output signal of the amplifier in a steady state based on the output signal characteristic for a control voltage value in the steady state after a predetermined control voltage is input when a predetermined input high frequency signal amplitude is input, and wherein the distortion compensation adjustment section has a phase compensation circuit for adjusting the amplitude of the signal having a phase component and adjusting the input high frequency signal amplitude to the amplifier.

According to this configuration, further high-accuracy distortion compensation processing can be realized in the mobile station wireless communication apparatus for transmitting in the polar modulation system in addition to the advantage of any of the second to fifth adaptive distortion compensation processing systems described above.

The adaptive distortion compensation processing system of the invention, thirteenth, is the twelfth adaptive distortion compensation processing system described above wherein the phase compensation circuit has a variable attenuation circuit or a variable gain amplifier provided between the phase modulation section and the amplifier.

According to this configuration, the configuration can be simplified in addition to the advantage of the twelfth adaptive distortion compensation processing system described above.

A polar modulation transmitter of the invention, thirteenth, is a polar modulation transmitter including a polar modulation section for generating an amplitude signal from a baseband orthogonal signal generated based on transmission data; an amplitude modulation section for generating an amplitude modulation signal based on the amplitude signal; a phase modulation section for generating a phase modulation signal in a wireless frequency band based on a signal having at least a phase component of the baseband orthogonal signal; an amplifier for generating transmission data in the wireless frequency band by inputting the phase modulation signal as an input high frequency signal and inputting the amplitude modulation signal as a control signal; and a distortion compensation processing section having a predistortion compensation section for storing predetermined distortion compensation processing data and performing predetermined distortion compensation processing based on the distortion compensation processing data for at least one of an input signal to the amplitude modulation section and an input signal to the phase modulation section using the amplitude signal as a reference signal and a distortion compensation adjustment section for making a distortion adjustment to a signal output from the predistortion compensation section or the reference signal based on modulation.

According to this configuration, predistortion compensation processing of a multimode wireless communication apparatus can be realized while suppressing an increase in the distortion compensation processing data capacity and an increase in the circuit scale of the distortion compensation processing circuit.

A polar modulation transmitter of the invention, fourteenth, is a polar modulation transmitter including a polar modulation section for generating an amplitude signal from a baseband orthogonal signal generated based on transmission data; an amplitude modulation section for generating an amplitude modulation signal based on the amplitude signal; a phase modulation section for generating a phase modulation signal in a wireless frequency band based on a signal having at least a phase component of the baseband orthogonal signal; an amplifier for generating transmission data in the wireless frequency band by inputting the phase modulation signal as an input high frequency signal and inputting the amplitude modulation signal as a control signal; and a distortion compensation processing section having a predistortion compensation section for storing predetermined distortion compensation processing data and performing predetermined distortion compensation processing based on the distortion compensation processing data for at least one of an input signal to the amplitude modulation section and an input signal to the phase modulation section using the amplitude signal as a reference signal and a distortion compensation adjustment section for making a distortion adjustment to a signal output from the predistortion compensation section or the reference signal, wherein the predistortion compensation section has a steady state characteristic compensation circuit for linearizing the output signal of the amplifier in a steady state based on the output signal characteristic for a control voltage value in the steady state after a predetermined control voltage is input when a predetermined input high frequency signal amplitude is input, wherein the distortion compensation adjustment section has a first amplitude information adjustment section for adjusting the amplitude of the amplitude signal after execution of distortion compensation processing in the steady state characteristic compensation circuit and compensating for a transient response characteristic of the output signal from the amplifier at the control voltage driving time, and wherein the first amplitude information adjustment section is a multiplying digital-analog conversion circuit.

According to this configuration, highly accurate distortion compensation processing can be realized according to the simple circuit configuration.

The polar modulation transmitter of the invention, fifteenth, is the fourteenth polar modulation transmitter wherein the distortion compensation adjustment section adjusts a reference potential of the multiplying digital-analog conversion circuit in response to an environmental temperature.

According to this configuration, the characteristic change of the power amplifier at the environmental temperature change time can be compensated for in addition to the advantage of the fourteenth polar modulation transmitter.

The polar modulation transmitter of the invention, sixteenth, is the fourteenth polar modulation transmitter further including a detection section for finding out of band power in two frequency bands of predetermined same detuning frequencies from the center frequency of the output signal of the amplifier.

According to this configuration, the effect of the distortion compensation processing can be checked in addition to the advantage of the fourteenth polar modulation transmitter.

The polar modulation transmitter of the invention, seventeenth, is the sixteenth polar modulation transmitter wherein the distortion compensation adjustment section adjusts the reference potential of the multiplying digital-analog conversion circuit based on plus or minus of the difference between the relative difference of the out of band power and a predetermined threshold value.

According to this configuration, the adaptive distortion compensation processing can be performed without the need for a synchronization adjustment circuit for synchronizing the input baseband signal and the output signal of the power amplifier in addition to the advantage of the sixteenth polar modulation transmitter.

The polar modulation transmitter of the invention, eighteenth, is the seventeenth polar modulation transmitter described above further including a distortion compensation adjustment determination section for switching between execution and non-execution of the adjustment of the reference potential of the multiplying digital-analog conversion circuit in the distortion compensation adjustment section.

According to this configuration, further high-accuracy adaptive distortion compensation processing can be realized in addition to the advantage of the seventeenth polar modulation transmitter described above.

An integrated circuit of the invention includes any of the first to eighteenth polar modulation transmitters.

According to this configuration, the circuit scale can be decreased in addition to the advantage of the first to eighteenth polar modulation transmitters described above.

A polar modulation transmission method of the invention, first, has the steps of generating an amplitude signal from a baseband orthogonal signal generated based on transmission data; generating an amplitude modulation signal based on the amplitude signal by an amplitude modulation section; generating a phase modulation signal in a wireless frequency band based on a signal having at least a phase component of the baseband orthogonal signal by a phase modulation section; generating transmission data in the wireless frequency band by an amplifier by inputting the phase modulation signal as an input high frequency signal and inputting the amplitude modulation signal as a control signal; finding out of band power in two frequency bands of predetermined same detuning frequencies from the center frequency of the output signal of the amplifier by a detection section; performing predetermined distortion compensation processing by a predistortion compensation section storing predetermined distortion compensation processing data based on the distortion compensation processing data for at least one of an input signal to the amplitude modulation section and an input signal to the phase modulation section using the amplitude signal as a reference signal; and making a distortion adjustment to a signal output from the predistortion compensation section or the reference signal based on output of the detection section.

According to this method, the adaptive distortion compensation processing can be performed without the need for a synchronization adjustment circuit for synchronizing the input baseband signal and the output signal of the power amplifier.

An adaptive distortion compensation processing method of the invention, first, is an adaptive distortion compensation processing method of an adaptive distortion compensation processing system including a mobile station wireless communication apparatus having a distortion compensation processing circuit and a base station wireless communication apparatus, and has the steps of transmitting and receiving data in the base station wireless communication apparatus to and from the mobile station wireless communication apparatus; branching a signal output from the first antenna at the reception operation time of the base station wireless communication apparatus and finding out of band power in two frequency bands of predetermined same detuning frequencies from the center frequency of the branch signal; and converting relative difference information of the out of band power into transmission data from the base station transceiver to control compensation data relevant to a transmitter of the mobile station wireless communication apparatus.

According to this method, the loss caused by branching the output signal of the power amplifier forming a part of the mobile station wireless communication apparatus and shortening of the telephone conversion time and the data communication time of the mobile station wireless communication apparatus caused by an increase in the consumption current in the acquisition part of the ACPR characteristic can be solved.

A polar modulation transmission method of the invention, second, has the steps of generating an amplitude signal from a baseband orthogonal signal generated based on transmission data; generating an amplitude modulation signal based on the amplitude signal by an amplitude modulation section; generating a phase modulation signal in a wireless frequency band based on a signal having at least a phase component of the baseband orthogonal signal by a phase modulation section; generating transmission data in the wireless frequency band by an amplifier by inputting the phase modulation signal as an input high frequency signal and inputting the amplitude modulation signal as a control signal; performing predetermined distortion compensation processing by a predistortion compensation section storing predetermined distortion compensation processing data based on the distortion compensation processing data for at least one of an input signal to the amplitude modulation section and an input signal to the phase modulation section using the amplitude signal as a reference signal; and making a distortion adjustment to a signal output from the predistortion compensation section or the reference signal based on modulation speed.

According to this method, predistortion compensation processing of a multimode wireless communication apparatus can be realized while suppressing an increase in the distortion compensation processing data capacity and an increase in the circuit scale of the distortion compensation processing circuit.

A polar modulation transmission method of the invention, third, has the steps of generating an amplitude signal from a baseband orthogonal signal generated based on transmission data; generating an amplitude modulation signal based on the amplitude signal by an amplitude modulation section; generating a phase modulation signal in a wireless frequency band based on a signal having at least a phase component of the baseband orthogonal signal by a phase modulation section; generating transmission data in the wireless frequency band by an amplifier by inputting the phase modulation signal as an input high frequency signal and inputting the amplitude modulation signal as a control signal; performing predetermined distortion compensation processing by a predistortion compensation section storing predetermined distortion compensation processing data based on the distortion compensation processing data for at least one of an input signal to the amplitude modulation section and an input signal to the phase modulation section using the amplitude signal as a reference signal; and making a distortion adjustment to a signal output from the predistortion compensation section or the reference signal by the distortion compensation adjustment section, wherein the step of performing the distortion compensation processing by the predistortion compensation section has a step of linearizing the output signal of the amplifier in a steady state by a steady state characteristic compensation circuit based on the output signal characteristic for a control voltage value in the steady state after a predetermined control voltage is input when a predetermined input high frequency signal amplitude is input, and wherein the step of making the adjustment by the distortion compensation adjustment section has a step of adjusting the amplitude of the amplitude signal after execution of distortion compensation processing in the steady state characteristic compensation circuit and compensating for a transient response characteristic of the output signal from the amplifier at the control voltage driving time by a multiplying digital-analog conversion circuit.

According to this method, highly accurate distortion compensation processing can be realized according to the simple circuit configuration.

ADVANTAGES OF THE INVENTION

According to the invention, there can be provided a polar modulation transmitter that can realize low distortion characteristic of a power amplifier at the amplitude modulation operation time, at the modulation speed switching time, etc., while suppressing an increase in the distortion compensation processing data capacity and an increase in the circuit scale of a distortion compensation processing circuit and a polar modulation transmitter that can perform adaptive distortion compensation processing without the need for a synchronization adjustment circuit for synchronizing an input baseband signal and an output signal of the power amplifier.

BRIEF DESCRIPTION OF THE DRAWINGS

FIG. 17 is a drawing to show an example of table data stored in a sixth coefficient selection section.

FIG. 21 is a drawing to show an example of table data stored in a seventh coefficient selection section.

FIG. 22 is a drawing to show the relationship between modulation speed and modulation speed information D7.

DESCRIPTION OF REFERENCE NUMERALS

Figure 1:
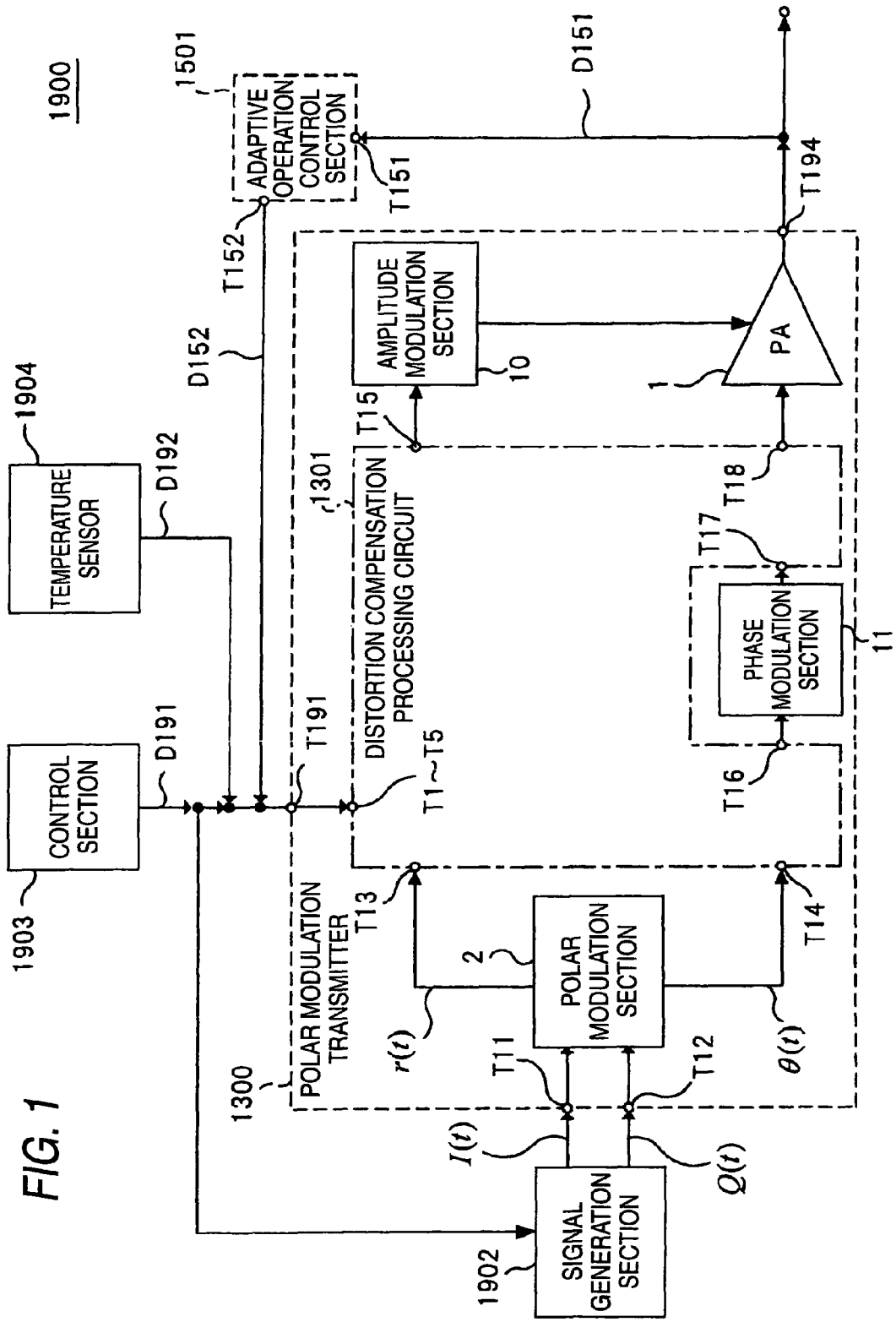
FIG. 1 is a diagram to show an example of a polar modulation transmitter in a first embodiment of the invention.

1 Power amplifier
2 Polar modulation section
3, 1301, 1601, 2001, 2401 Distortion compensation processing circuit
4, 5 Delay adjustment section
6, 102 Memory
7, 7a, 7b Address generation section 8 Amplitude information correction section
9 Phase information correction section
10 Amplitude modulation section
11 Phase modulation section
12 Amplitude and phase measurement section
20, 1300, 2000, 2400, 2500, 2600 Polar modulation transmitter
103 First amplitude information adjustment section
103a, 105a, 105b, 1603, 2003 Multiplication circuit
104 First coefficient selection section
105 Second amplitude information adjustment section
106 Second coefficient selection section
107 Third coefficient selection section
108 Variable attenuation circuit
109 Fourth coefficient selection section
901 Computation processing circuit
1101 Addition circuit
1302 Fifth coefficient selection section
1501 Adaptive operation control section
1502, 1805, 1813 Frequency conversion circuit
1503 Detection section
1504 Coefficient adjustment determination section
1602 Sixth coefficient selection section
1800 Adaptive distortion compensation processing system
1801 Mobile station wireless communication apparatus
1802 Signal generation section
1803 Control section
1804 Mobile station receiver
1806 Demodulation section
1811 Base station wireless communication apparatus
1812 Base station transceiver
1814 Signal processing section
1815 Conversion section
1900 Wireless communication apparatus transmission section
1902 Signal generation section
1903 Control section
1904 Temperature sensor
2002 Seventh coefficient selection section
2402 MDAC
2501 Orthogonal coordinate conversion section
2502 Amplitude control section
2503 Orthogonal transformation section

BEST MODE FOR CARRYING OUT THE INVENTION

Embodiments of the invention will be discussed below in detail with reference to the accompanying drawings:

First Embodiment

A first embodiment of the invention describes an adaptive predistortion compensation processing technology for characteristic change of a power amplifier caused by environmental temperature change of a wireless communication apparatus, etc., without the need for a synchronization adjustment circuit for synchronizing an input baseband signal and an output signal of the power amplifier.

FIG. 1 is a diagram to show the schematic configuration of a transmission section of a wireless communication apparatus using a polar modulation transmitter according to the first embodiment of the invention.

As shown in FIG. 1, a wireless communication apparatus transmission section 1900 includes a polar modulation transmitter 1300, a signal generation section 1902, a control section 1903, a temperature sensor 1904, and an adaptive operation control section 1501. The polar modulation transmitter 1300 includes a power amplifier 1, a polar modulation section 2, a distortion compensation processing circuit 1301, an amplitude modulation section 10, and a phase modulation section 11.

The control section 1903 outputs a control signal D191 having at least one of transmission level information of a control signal for setting the output level from the power amplifier 1, transmission frequency information, and a mode selection signal for setting a modulation mode of a signal output from the signal generation section 1902.

The temperature sensor 1904 outputs a control signal D192 containing temperature information. Consumption current information of the power amplifier 1 equivalent to the temperature information may be used as the control signal D192 by providing a monitor circuit for monitoring consumption current (collector current, etc.,) of the power amplifier 1 in place of the temperature sensor 1904.

The signal generation section 1902 generates a baseband orthogonal coordinate signal (IQ signal) from transmission data based on user operation having the wireless communication apparatus transmission section 1900 in a modulation mode set by the control signal D191 output from the control section 1903, and outputs the IQ signal to the polar modulation section 2 through signal input terminals T11 and T12.

The adaptive operation control section 1501 finds out of band power in two frequency bands of predetermined same detuning frequencies from the center frequency of the output signal of the power amplifier 1 and outputs a control signal D152 containing relative difference information of the out of band power, etc.

Input to the polar modulation transmitter 1300 are the control signal D191 from the control section 1903 through a signal input terminal T191, the control signal D192 from the control section 1903, and a control signal D193 from the adaptive operation control section 1501.

The distortion compensation processing circuit 1301 has a distortion compensation section including a predistortion processing section for storing predetermined distortion compensation processing data and performing predistortion processing, the distortion compensation section for performing distortion compensation for an amplitude signal and a phase signal output from the polar modulation section 2 and a distortion compensation adjustment section for making an adjustment to the distortion compensation processing in the distortion compensation section based on the control signals D191 to D193 input through the signal input terminal T191 of the polar modulation transmitter 1300.

Although it is not easy to previously acquire the dynamic characteristic of the power amplifier (AM-AM dynamic characteristic, AM-PM dynamic characteristic), the distortion compensation processing circuit 1301 compensates for the dynamic characteristic of the power amplifier with high accuracy for its simple configuration as the distortion compensation adjustment section performs predetermined computation processing for the distortion compensation processing in the distortion compensation section based on the AM-AM forward characteristic, the AM-PM forward characteristic of the power amplifier acquired by supplying a control voltage in a steady state.

The polar modulation transmitter according to the first embodiment of the invention can realize adaptive distortion compensation processing without increasing the circuit scale of the synchronization adjustment circuit as the distortion compensation processing circuit 1301 makes an adjustment to the distortion compensation in the distortion compensation section based on the control signal D152 from the adaptive operation control section 1501.

Figure 2:
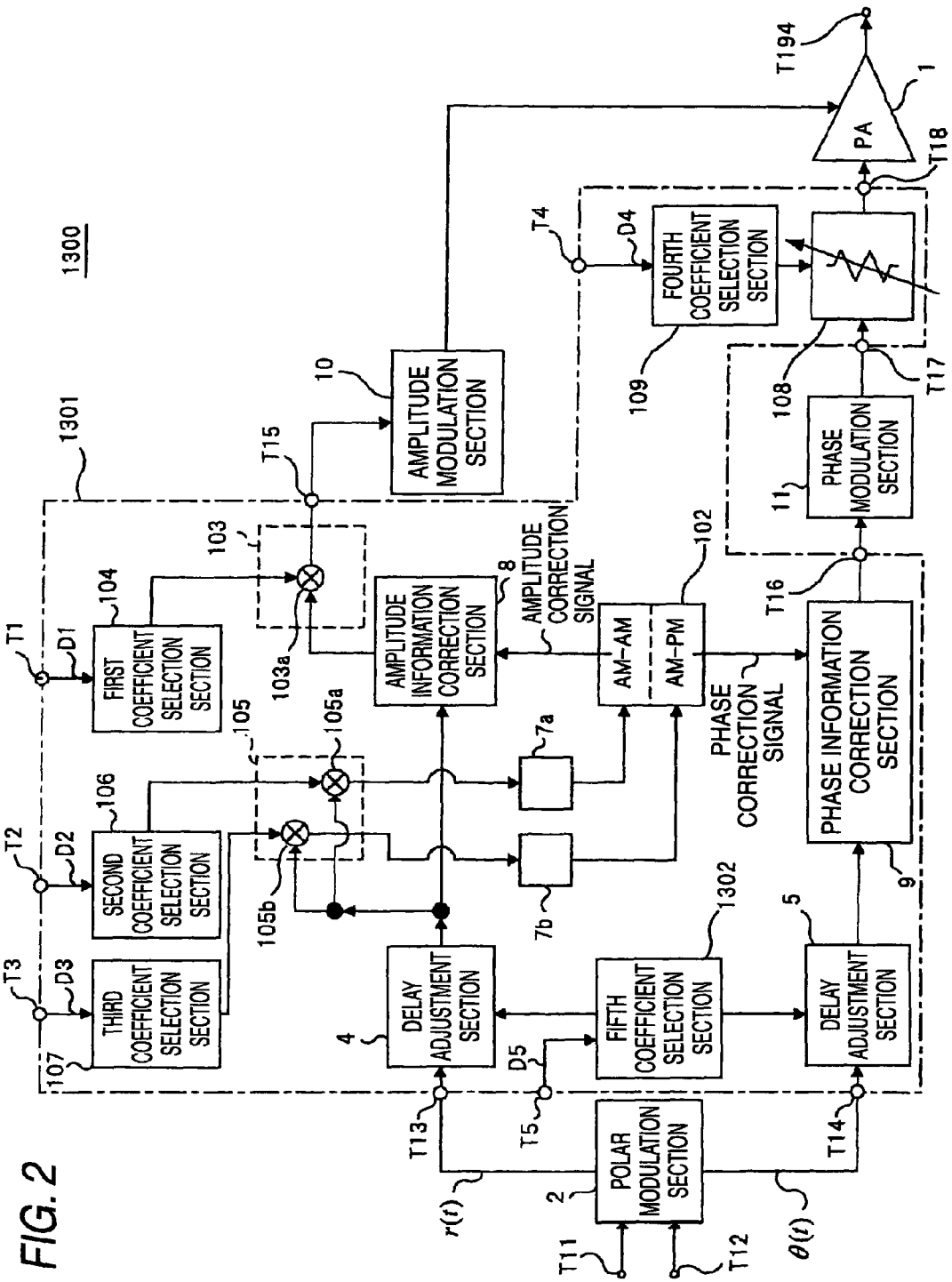
FIG. 2 is a diagram to show an example of the polar modulation transmitter in the first embodiment of the invention.

FIG. 2 is a diagram to show the schematic configuration of the polar modulation circuit according to the first embodiment.

As shown in FIG. 2, the polar modulation transmitter 1300 includes the power amplifier 1, the polar modulation section 2, the distortion compensation processing circuit 1301, the amplitude modulation section 10, and the phase modulation section 11. The distortion compensation processing circuit 1301 includes delay adjustment sections 4 and 5, address generation sections 7a and 7b, an amplitude information correction section 8, a phase information correction section 9, memory 102, a first amplitude information adjustment section 103 having a multiplication circuit 103a, a first coefficient selection section 104 having a signal input terminal T1, a second amplitude information adjustment section 105 having multiplication circuits 105a and 105b, a second coefficient selection section 106 having a signal input terminal T2, a third coefficient selection section 107 having a signal input terminal T3, a variable attenuation circuit 108, a fourth coefficient selection section 109 having a signal input terminal T4, and a fifth coefficient selection section 1302 having a signal input terminal T5.

Figure 27:
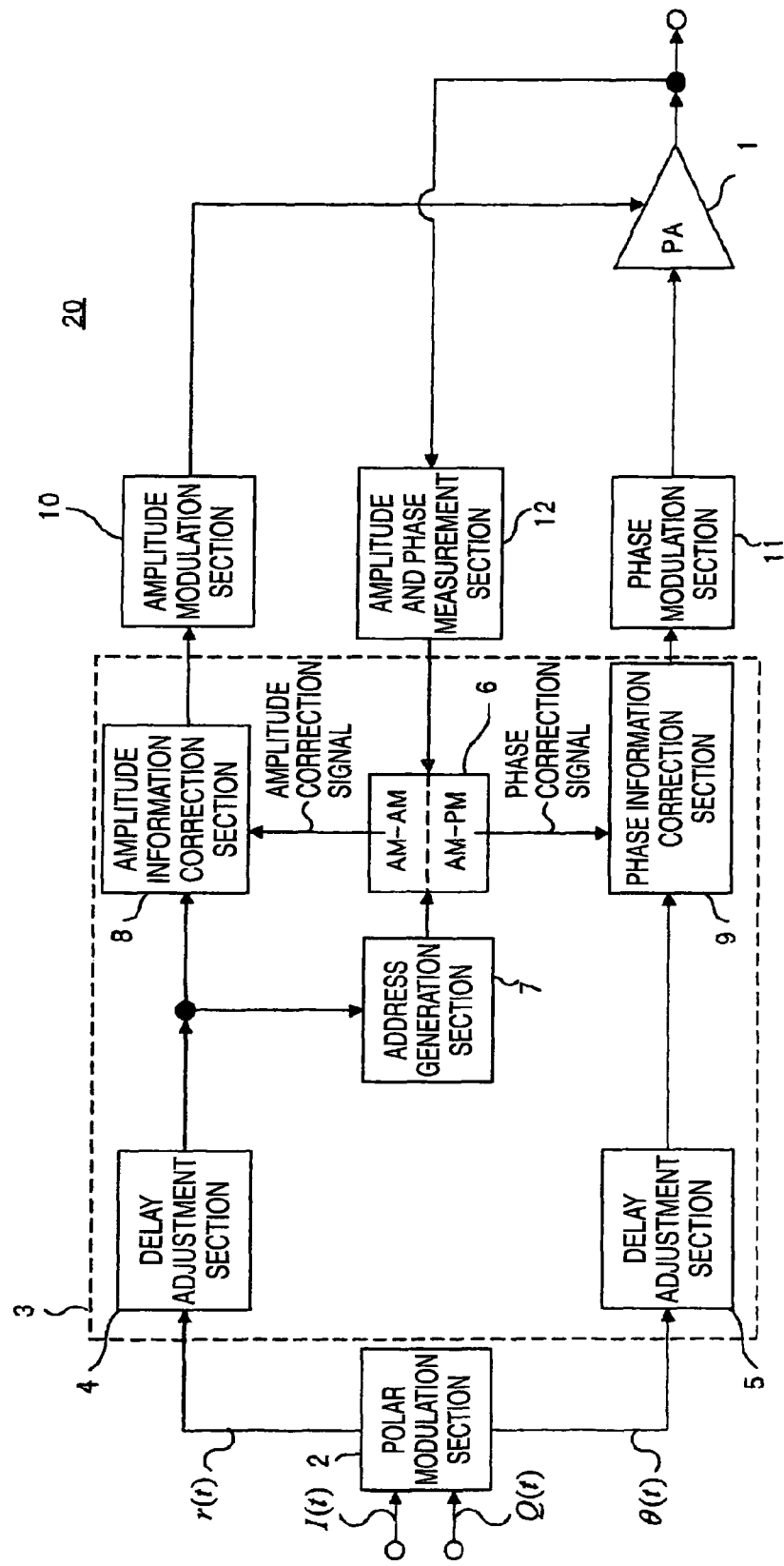
FIG. 27 is a diagram to show a polar modulation transmitter in a related art.

That is, the polar modulation transmitter 1300 in the first embodiment of the invention deletes the amplitude and phase measurement section 12 in the polar modulation transmitter 20 in the related art shown in FIG. 27 and includes the memory 102 and the address generation sections 7a and 7b in place of the memory 6 and the address generation section 7. It newly includes the first amplitude information adjustment section 103, the first coefficient selection section 104, the second amplitude information adjustment section 105, the second coefficient selection section 106, the third coefficient selection section 107, the variable attenuation circuit 108, and the fourth coefficient selection section 109. The polar modulation section 2, the delay adjustment section 5, and the phase information correction section 9 are the same as the components described with FIG. 27 in Background Art in the operation and the function will not be discussed again.

The delay adjustment sections 4 and 5 operate as an example of a delay adjustment section of a distortion compensation section, the amplitude information correction section 8, the phase information correction section 9, and the memory 102 operate as an example of the predistortion processing section of the distortion compensation section, and the first coefficient selection section 104, the second coefficient selection section 105, the third coefficient selection section 107, the fourth coefficient selection section 106, and the fifth coefficient selection section 1302 operate as an example of a distortion compensation adjustment section.

To begin with, the configuration of the distortion compensation processing circuit 1301 will be discussed.

The delay adjustment section 4 gives a predetermined delay to amplitude information output from the polar modulation section 2 and outputs the amplitude information after subjected to the delay adjustment to the second coefficient selection section 105 and the amplitude information correction section 8.

Figure 3:
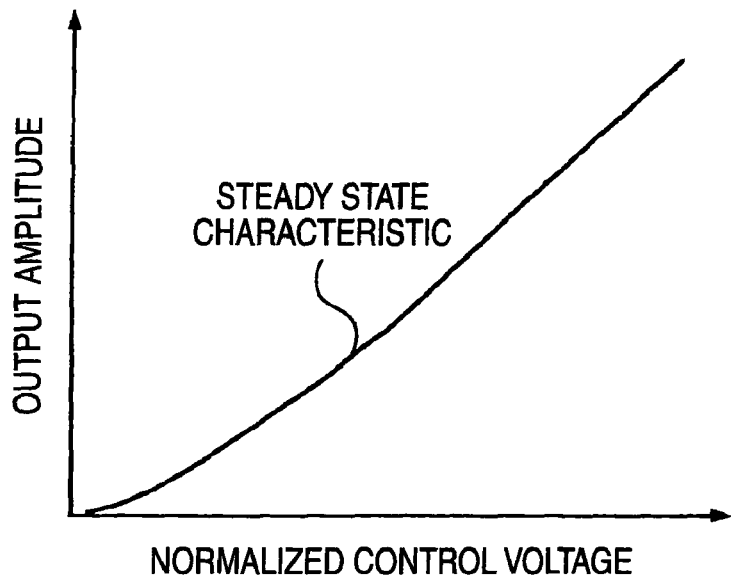
FIG. 3 shows AM-AM characteristic of a power amplifier.
Figure 4:
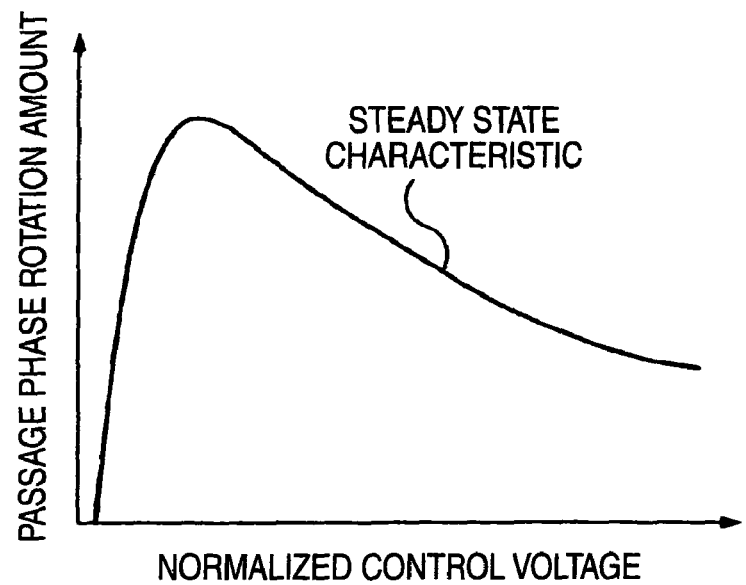
FIG. 4 shows AM-PM characteristic of the power amplifier.

The memory 102 stores the inverse characteristics of the AM-AM forward characteristic and the AM-PM forward characteristic of the power amplifier 1 previously acquired using a network analyzer, etc. The AM-AM forward characteristic and the AM-PM forward characteristic of the power amplifier 1 are those shown in FIGS. 3 and 4, for example. In FIG. 3, the horizontal axis indicates the normalized control voltage normalized at the maximum value of the control voltage supplied to the power amplifier 1, the vertical axis indicates the output amplitude from the power amplifier 1, and the solid line in the figure indicates the steady state characteristic of the output amplitude relative to the normalized control voltage. Next, in FIG. 4, the horizontal axis indicates the normalized control voltage, the vertical axis indicates the phase difference between an input high-frequency signal to the power amplifier 1 and an output high-frequency signal therefrom, namely, the passage phase rotation amount of the power amplifier 1, and the solid line in the figure indicates the steady state characteristic of the passage phase rotation amount relative to the normalized control voltage. An amplitude correction signal of the inverse characteristic of the power amplifier 1 is output to the amplitude information correction section 8 in response to an address signal output from the address generation section 7a and a phase correction signal of the inverse characteristic of the power amplifier 1 is output to the phase information correction section 9 in response to an address signal output from the address generation section 7b. The characteristics in FIGS. 3 and 4 show the steady state characteristics at the point in time at which output of the power amplifier is stabilized after the control voltage is supplied.

The address generation section 7a converts the amplitude information output from the multiplication circuit 105a forming a part of the second amplitude information adjustment section 105 into a discrete value in a predetermined range and having a predetermined step width found from the AM-AM inverse characteristic data stored in the memory 102 and the compensation accuracy and then generates an address signal to reference the AM-AM inverse characteristic data stored in the memory 102.

The address generation section 7b converts the amplitude information output from the multiplication circuit 105b forming a part of the second amplitude information adjustment section 105 into a discrete value in a predetermined range and having a predetermined step width found from the AM-PM inverse characteristic data stored in the memory 102 and the compensation accuracy and then generates an address signal to reference the AM-PM inverse characteristic data stored in the memory 102.

The amplitude information correction section 8 makes a correction to the amplitude information output from the delay adjustment section 4 based on the amplitude correction signal output from the memory 102 and outputs the amplitude information after subjected to the correction to the first amplitude information adjustment section 103.

The first amplitude information adjustment section 103 is implemented as the multiplication circuit 103a. The multiplication circuit 103a multiplies the amplitude information output from the amplitude information correction section 8 by first coefficient information (coeff 1) output from the first coefficient selection section 104 and outputs the amplitude information after multiplied by the first coefficient information to the amplitude modulation section 10.

Figures 5, 6:
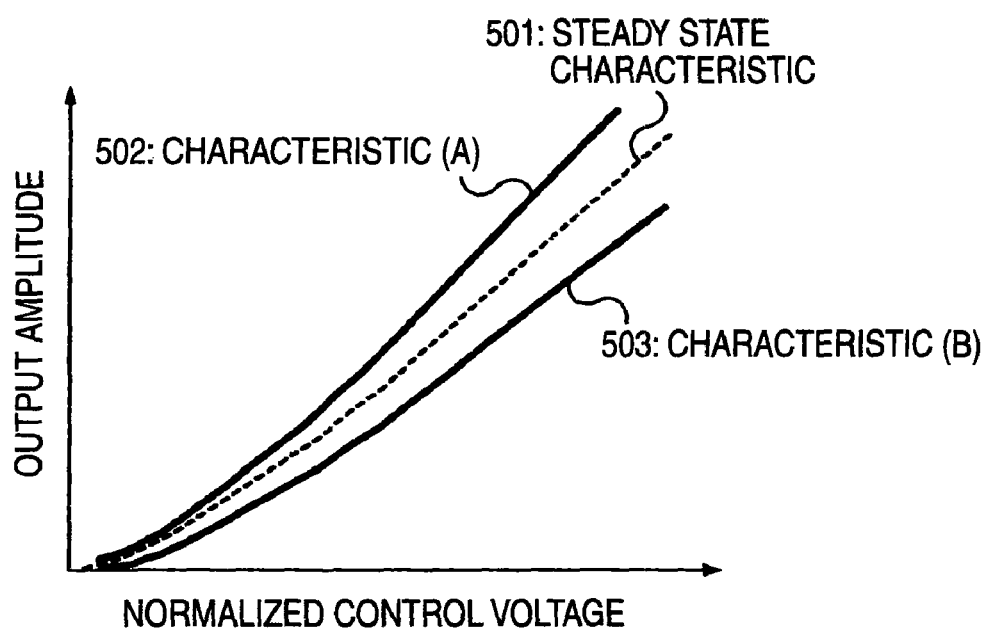
FIG. 5 is a drawing to show an example of table data stored in a first coefficient selection section.
FIG. 6 shows AM-AM characteristic of the power amplifier.

To set the first coefficient information (coeff 1) by which amplitude information is to be multiplied in the multiplication circuit 103a, the first coefficient selection section 104 previously stores coefficient information corresponding to predetermined data D1 input from the signal input terminal T1 as table data shown in FIG. 5. The first column of the table data shown in FIG. 5 indicates the address number of the table data and the second column indicates the coefficient information (coeff 1) set according to a method described later.

The second amplitude information adjustment section 105 is made up of the multiplication circuits 105a and 105b. The multiplication circuit 105a multiplies the amplitude information output from the delay adjustment section 4 by second coefficient information (coeff 2) output from the second coefficient selection section 106 and outputs the amplitude information after multiplied by the second coefficient information to the address generation section 7a. The multiplication circuit 105b multiplies the amplitude information output from the delay adjustment section 4 by third coefficient information (coeff 3) output from the third coefficient selection section 107 and outputs the amplitude information after multiplied by the third coefficient information to the address generation section 7b. The second amplitude information adjustment section 105 is characterized by the fact that it can multiply the amplitude information based on which the address generation sections 7a and 7b generate address signals to reference the AM-AM inverse characteristic and to reference the AM-PM inverse characteristic by different coefficient information.

To set the coefficient information (coeff 2) by which amplitude information is to be multiplied in the multiplication circuit 105a, the second coefficient selection section 106 previously stores coefficient information corresponding to predetermined data D2 input from the signal input terminal T2 as table data. The table data is provided by replacing the second column of the table data shown in FIG. 5 with the coefficient information (coeff 2) set according to the method described later.

To set the coefficient information (coeff 3) by which amplitude information is to be multiplied in the multiplication circuit 105b, the third coefficient selection section 107 previously stores coefficient information corresponding to predetermined data D3 input from the signal input terminal T3 as table data. The table data is provided by replacing the second column of the table data shown in FIG. 5 with coefficient information (coeff 3) set according to the method described later.

The amplitude modulation section 10 drives the control voltage of the power amplifier 1 based on the amplitude information output from the multiplication circuit 103a.

The phase modulation section 11 executes phase modulation based on the phase information after subjected to the correction output from the phase information correction section 9 and outputs a phase modulation signal to the variable attenuation circuit 108.

The variable attenuation circuit 108 adjusts the amplitude value (attenuation amount) of the phase modulation signal output from the phase modulation section 11 in response to coefficient information (coeff 4) output from the fourth coefficient selection section 109 and outputs the phase modulation signal after subjected to the amplitude control to the power amplifier 1. That is, it adjusts the input high-frequency signal amplitude to the power amplifier 1. Although the variable attenuation circuit is used in the example in FIG. 2, a variable gain amplifier may be used.

To set the coefficient information (coeff 4) to determine the attenuation amount in the variable attenuation circuit 108, the fourth coefficient selection section 109 previously stores coefficient information corresponding to predetermined data D4 input from the signal input terminal T4 as table data. The table data is provided by replacing the second column of the table data shown in FIG. 5 with coefficient information (coeff 4) set according to the method described later.

The power amplifier 1 combines amplitude modulation with the phase modulation signal output from the phase modulation section 11 based on an output signal from the amplitude modulation section 10 as a control signal.

Subsequently, to describe the distortion compensation operation of the distortion compensation processing circuit 1301, predistortion processing using the memory section 102, the amplitude information correction section 8, and the phase information correction section 9 and compensation processing based on delay adjustment using the delay adjustment sections 4 and 5 will be discussed separately. As for the predistortion processing, an AM-AM dynamic characteristic compensation method and an AM-PM dynamic characteristic compensation method of the power amplifier 1 will be discussed separately.

The AM-AM dynamic characteristic compensation method of the power amplifier 1 will be discussed about the two points of use of the multiplication circuit 103a and the first coefficient selection section 104 and use of the multiplication circuit 105a and the second coefficient selection section 106.

The AM-PM dynamic characteristic compensation method of the power amplifier 1 will be discussed about the two points of use of the multiplication circuit 105b and the third coefficient selection section 107 and use of the variable attenuation circuit 108.

To begin with, the AM-AM dynamic characteristic compensation method using the multiplication circuit 103a and the first coefficient selection section 104 will be discussed with FIG. 6. Here, the second coefficient information (coeff 2) is assumed to be 1.

In FIG. 6, the horizontal axis indicates the normalized control voltage normalized at a predetermined value of the control voltage supplied to the power amplifier 1, and the vertical axis indicates the output amplitude from the power amplifier 1.

A steady state characteristic 501 indicated by the dotted line indicates the steady state characteristic of the output amplitude relative to the normalized control voltage (AM-AM forward characteristic) and is the same as the steady state characteristic shown in FIG. 3.

A characteristic (A) 502 indicated by the solid line indicates the forward characteristic of the AM-AM characteristic stored in the memory 102 to obtain amplitude information equal to the amplitude information after subjected to AM-AM characteristic compensation using the steady state characteristic 501 as an input signal to the amplitude modulation section 10 if the first coefficient information (coeff 1) satisfies expression (1).

A characteristic (B) 503 indicated by the solid line indicates the forward characteristic of the AM-AM characteristic stored in the memory 102 to obtain amplitude information equal to the amplitude information after subjected to AM-AM characteristic compensation using the steady state characteristic 501 as an input signal to the amplitude modulation section 10 if the first coefficient information (coeff 1) satisfies expression (2).

$$\text{coeff 1} > 1 \tag{1}$$

$$\text{coeff 1} < 1 \tag{2}$$

For example, the relationship mentioned above indicates that the AM-AM forward characteristic of the power amplifier 1 in a steady operation state and the AM-AM forward characteristic data at the characteristic acquiring time of the power amplifier 1 can be applied to compensation when an error occurs for some reason, such as change in the environmental temperature or change in the transmission frequency, or the AM-AM dynamic characteristic of the power amplifier 1 in an amplitude modulation operation state and the AM-AM forward characteristic data at the characteristic acquiring time of the power amplifier 1 can be applied to compensation when an error occurs.

Therefore, a similar effect to that of adjusting the inverse characteristic stored in the memory 102 can be provided by adjusting the first coefficient information (coeff 1) without changing the inverse characteristic stored in the memory 102.

Next, the AM-AM dynamic characteristic compensation method using the multiplication circuit 105a and the second coefficient selection section 106 also involves a similar relationship and will be discussed with FIG. 6 as with the description given above. Here, the first coefficient information (coeff 1) is assumed to be 1.

The forward characteristic of the AM-AM characteristic stored in the memory 102 to obtain amplitude information equal to the amplitude information after subjected to AM-AM characteristic compensation using the steady state characteristic 501 as an input signal to the amplitude modulation section 10 if the second coefficient information (coeff 2) satisfies expression (3) in multiplication processing of the second coefficient information (coeff 2) in the multiplication circuit 105a is the characteristic (A) 502.

The forward characteristic of the AM-AM characteristic stored in the memory 102 to obtain amplitude information equal to the amplitude information after subjected to AM-AM characteristic compensation using the steady state characteristic 501 as an input signal to the amplitude modulation section 10 if the second coefficient information (coeff 2) satisfies expression (4) in multiplication processing of the second coefficient information (coeff 2) in the multiplication circuit 105a is the characteristic (B) 503.

Therefore, a similar effect to that of adjusting the inverse characteristic stored in the memory 102 can be provided by adjusting the second coefficient information (coeff 2) without changing the inverse characteristic stored in the memory 102 as with the description of the AM-AM dynamic characteristic compensation method using the multiplication circuit 103a and the first coefficient selection section 104.

$$\text{coeff } 2 > 1 \quad (3)$$

$$\text{coeff } 2 < 1 \quad (4)$$

Figures 7, 8:
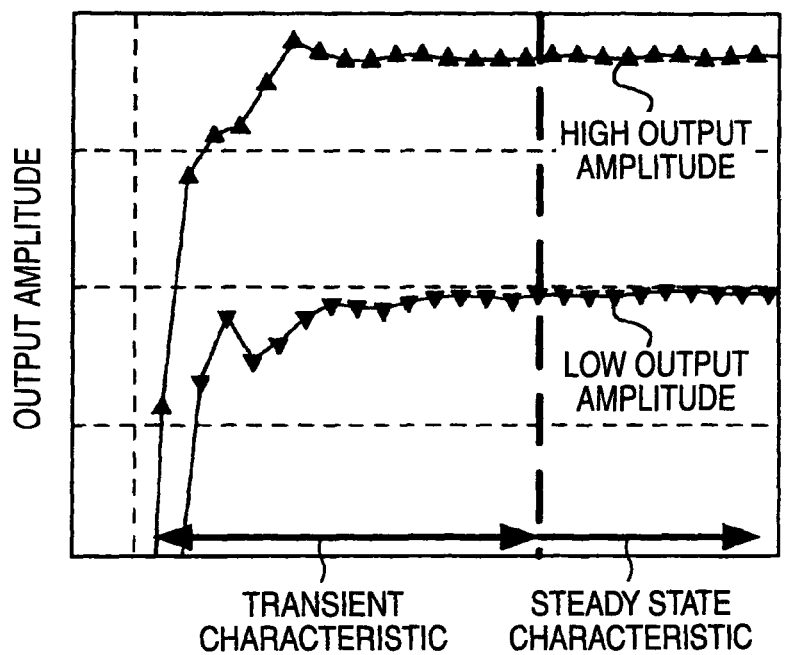
FIG. 7 is a drawing to show the relationship between transmission power definition and transmission level information.
FIG. 8 is a drawing to show the step response characteristic of the output amplitude to a control signal in a state in which an input high-frequency signal at a level at which the power amplifier performs saturation operation is given.

The following four examples can be given as the data D1 input to the first coefficient selection section 104:

The first example of the data D1 is transmission level information of the power amplifier 1 contained in the control signal D191 transmitted from the control section 1903 to implement the wireless communication apparatus transmission section 1900 using the polar modulation transmitter 1300; FIG. 7 shows a specific example.

The first column of the table data shown in FIG. 7 indicates the power value [dBm] of uplink transmission power definition for the wireless communication apparatus transmission section for transmitting with 8-PSK demodulation in a 900-MHz GSM band, described in GSM Specification, and the second column indicates the transmission level information D1.

The meaning of the table data will be discussed with FIG. 8.

FIG. 8 is a drawing to show the step response characteristic of the output signal amplitude relative to a control signal in a state in which the input high-frequency signal amplitude at a predetermined level is given to the power amplifier 1. In FIG. 8, the horizontal axis indicates the elapsed time since the point in time of inputting a control signal to the power amplifier, and the vertical axis indicates the output signal amplitude from the power amplifier 1. In the example in FIG. 8, the step response characteristics to two different control voltage values (steady control voltage values) are shown and differ in output amplitude from the power amplifier in the steady state characteristic. In the two step response characteristics shown in FIG. 8, the high output amplitude supplies a higher steady control voltage value than the low output amplitude.

To execute distortion compensation by referencing the AM-AM inverse characteristic data stored in the memory 102, any desired compensation effect cannot be provided because of the output response characteristic of the amplitude modulation section 10 or the power amplifier 1 for the amplitude modulation signal changing at high speed. However, from a study of the inventor, it was found that it is effective to previously measure the step response characteristic of the power amplifier 1 at the control voltage supplying time of a constant value to obtain average output power of a modulation signal for each transmission output power defined in the specification of a wireless system (for example, GSM Specification, etc.,) and multiply amplitude information by a predetermined value in response to the step response characteristic.

For example, if the transient response characteristic is in an overshoot state as at the high output amplitude time in FIG. 8, the first coefficient selection section 104 outputs the coefficient information (coeff 1) of less than 1 to the first amplitude information adjustment section 104 so as to attenuate the output signal from the multiplication circuit 103a to the amplitude modulation section 10 for the input signal from the amplitude information correction section 8 to the multiplication circuit 103a. Conversely, if the characteristic converges without exceeding a predetermined value during the transient response period as at the low output amplitude time in FIG. 8, the first coefficient selection section 104 outputs the coefficient information (coeff 1) of 1 or more to the multiplication circuit 103a so as to amplify the output signal for the input signal to the multiplication circuit 103a.

That is, the control voltage of a constant value to obtain average output power in a transmission modulation signal is applied and if the start characteristic of the power amplifier 1 is an overshoot, the amplitude information subjected to the correction in the steady state characteristic is compressed and if the start characteristic is the inverse characteristic of an overshoot, the amplitude information is decompressed, so that it is made possible to provide any desired output amplitude considering the effect of the transient response. The processing description is equivalent to execution of processing of finding the characteristic (A) 501 or the characteristic (B) 502 from the steady state characteristic 501 using the first coefficient information (coeff 1) as described with FIG. 6 in response to the transmission power level.

As described above, the first coefficient information (coeff 1) found for each transmission level is stored in the first coefficient selection section 104 in the format shown in FIG. 7. The case where the first coefficient information (coeff 1) takes a different value for each transmission level has been described. However, from the characteristic of the power amplifier 1, if the coefficient information takes the same value for close power values, thinned-out data may be stored so as to reduce the table data.

The amplitude information input to the amplitude information correction section 8 or the instantaneous amplitude value of an amplitude modulation signal can be named as the second example of the data D1. Accordingly, the first coefficient information (coeff 1) can be acquired at the finer step width than the transmission level and the first coefficient information (coeff 1) can be selected in response to the amplitude information input to the amplitude information correction section 8 or the instantaneous amplitude value of the amplitude modulation signal, whereby it is made possible to further improve the compensation accuracy.

The transmission frequency information contained in the control signal D191 transmitted from the control section 1903 shown in FIG. 1 can be named as the third example of the data D1. To change the transmission frequency, the AM-AM forward characteristic of the power amplifier 1 in the steady operation state or the AM-AM dynamic characteristic of the power amplifier 1 at the amplitude modulation operation time changes and thus the first coefficient information (coeff 1) is controlled based on the fact that the characteristic change can be represented by the relationship between the steady state characteristic 501 and the characteristic (A) 502 or the steady state characteristic 501 and the characteristic (B) 503 shown in FIG. 6, whereby the characteristic change can be compensated for.

The temperature information contained in the control signal D192 from the temperature sensor 1904 can be named as the fourth example of the data D1. Consumption current information from a monitor circuit for monitoring consumption current (collector current, etc.,) of the power amplifier 1 equivalent to the temperature information may be used in place of the temperature information.

If the environmental temperature changes, the AM-AM forward characteristic of the power amplifier 1 in the steady operation state or the AM-AM dynamic characteristic of the power amplifier 1 at the amplitude modulation operation time changes.

For example, it is assumed that the steady state characteristic 501 in FIG. 6 indicates the AM-AM forward characteristic at the normal temperature time (T0° C.) and the characteristic (A) 502 and the characteristic (B) 503 indicate the AM-AM forward characteristic at the low temperature time (T1° C.) and the AM-AM forward characteristic at the high temperature time (T2° C.) respectively. The temperature condition involves the relationship shown in expression (5). The characteristic changes depending on the device configuration and the structure of the power amplifier 4.

$$T1<T0<T2 \quad (5)$$

Since the effect of adjusting the inclination of the AM-AM forward characteristic on which the compensation data stored in the memory 102 is based is provided by performing the multiplication processing in the multiplication circuit 103a in FIG. 2, if the compensation data storing only the steady state characteristic at the normal temperature is used, coefficient information is provided as a table so as to represent change in the inclination of the AM-AM forward characteristic relative to the environmental temperature and optimum coefficient information is selected in response to the temperature condition, whereby the characteristic against the temperature can be improved.

Further, the case where the AM-AM inverse characteristic data at the normal temperature is stored in the memory as table data and the characteristic against the temperature is stored in the coefficient information also has the effect of decreasing the data capacity of the temperature compensation data as compared with the case where the AM-AM forward characteristic of the power amplifier 1 under a predetermined temperature condition is acquired and the AM-AM inverse characteristic data for each temperature is stored in the memory as table data.

The use of the multiplication circuit 103a and the first coefficient selection section 104 and the use of the multiplication circuit 105a and the second coefficient selection section 106 have a similar function as already described and thus four examples of the transmission level information, the amplitude information or the instantaneous amplitude value of the amplitude modulation signal, the transmission frequency information, and the temperature information can be given as the data D2 input to the second coefficient selection section 106 like the data D1.

Next, the AM-PM dynamic characteristic compensation method using the multiplication circuit 105b and the third coefficient selection section 107 will be discussed with FIG. 9.

Figure 9:
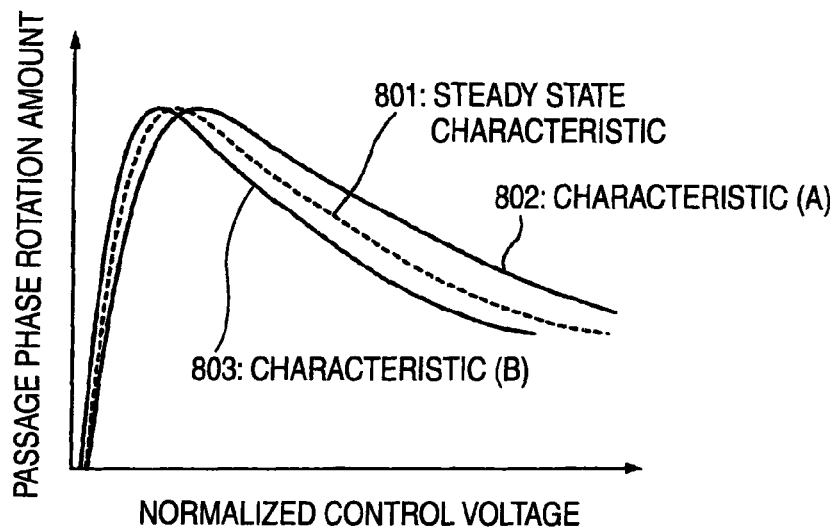
FIG. 9 shows AM-PM characteristic of the power amplifier.

In FIG. 9, the horizontal axis indicates the normalized control voltage and the vertical axis indicates the passage phase rotation amount of the power amplifier 1.

A steady state characteristic 801 indicated by the dotted line indicates the steady state characteristic of the passage phase rotation amount relative to the normalized control voltage (AM-PM forward characteristic) and is the same as the steady state characteristic shown in FIG. 4.

A characteristic (A) 802 indicated by the solid line indicates the forward characteristic of the AM-PM characteristic stored in the memory 102 to obtain phase information equal to the phase information after subjected to AM-PM characteristic compensation using the steady state characteristic 801 as an input signal to the phase modulation section 11 if the third coefficient information (coeff 3) satisfies expression (6).

A characteristic (B) 803 indicated by the solid line indicates the forward characteristic of the AM-PM characteristic stored in the memory 102 to obtain phase information equal to the phase information after subjected to AM-PM characteristic compensation using the steady state characteristic 801 as an input signal to the phase modulation section 11 if the third coefficient information (coeff 3) satisfies expression (7).

$$\text{coeff } 3>1 \quad (6)$$

$$\text{coeff } 3<1 \quad (7)$$

For example, the relationship mentioned above indicates that the AM-PM forward characteristic of the power amplifier 1 in a steady operation state and the AM-PM forward characteristic data at the characteristic acquiring time of the power amplifier 1 can be applied to compensation when an error occurs for some reason, such as change in the environmental temperature or change in the transmission frequency, or the AM-PM dynamic characteristic of the power amplifier 1 in an amplitude modulation operation state and the AM-PM forward characteristic data at the characteristic acquiring time of the power amplifier 1 can be applied to compensation when an error occurs.

Therefore, a similar effect to that of adjusting the inverse characteristic stored in the memory 102 can be provided by adjusting the third coefficient information (coeff 3) without changing the inverse characteristic stored in the memory 102.

Here, from a study of the inventor, it was found that to compensate for change in the AM-PM forward characteristic of the power amplifier 1 in the steady operation state accompanying environmental temperature change, if change in the area where the normalized control voltage is low is given more noticeably in the AM-PM forward characteristic, the larger compensation effect is provided.

Figure 10:
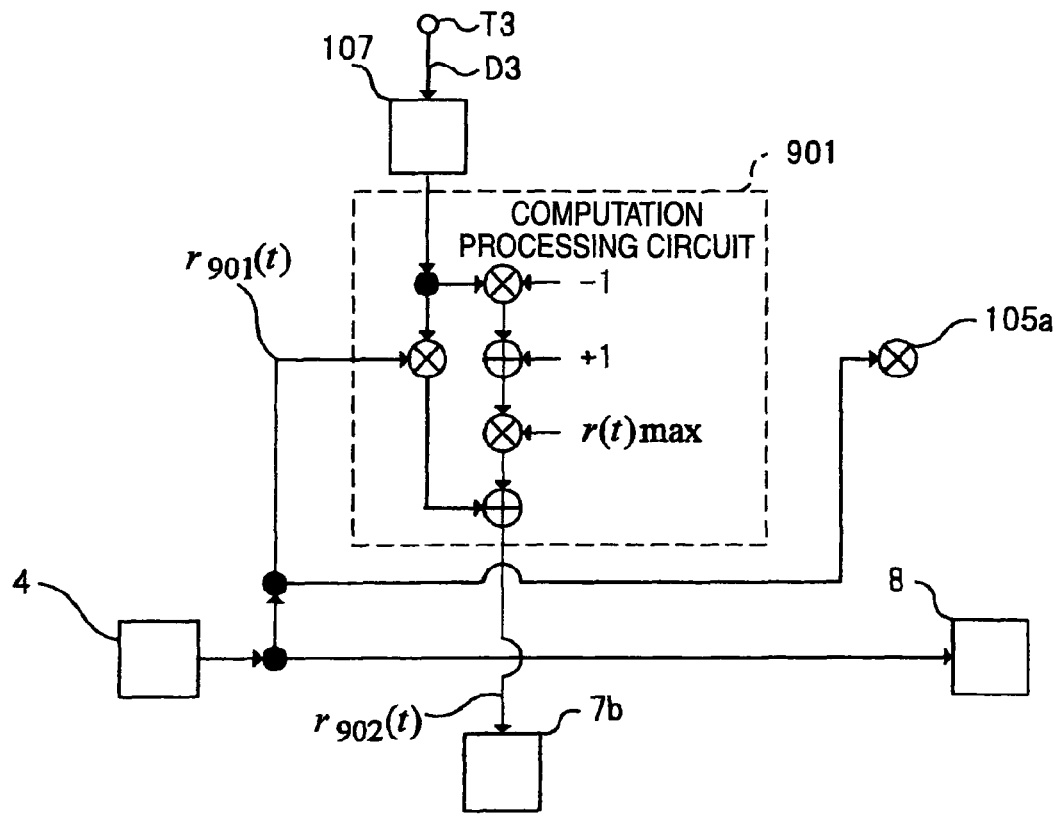
FIG. 10 is a diagram to show an example of the schematic configuration of a computation processing circuit.

Then, a computation circuit shown in FIG. 10 is devised. FIG. 10 shows only a peripheral circuit of a portion different from FIG. 2. That is, the circuit includes a computation processing circuit 901 made up of four multiplication circuits and two addition circuits in place of the multiplication circuit 105b in FIG. 2.

The configuration is adopted, whereby r901(t) and r902(t) become the relationship shown in expression (8) where r901(t) is the amplitude information output from the delay adjust ment section 4 and r902(t) is the amplitude information output from the computation processing circuit 901.

$$r902(t)=r901(t) \times \text{coeff}3 + r(t)\max \times (1-\text{coeff}3) \quad (8)$$

Here, r(t)max is the maximum value of the amplitude information output from the polar modulation section 2 and is set to 1, for example.

Next, the AM-PM dynamic characteristic compensation method realized by applying the third coefficient information (coeff 3) shown in expression (6) or (7) to expression (8) will be discussed with FIG. 11.

Figure 11:
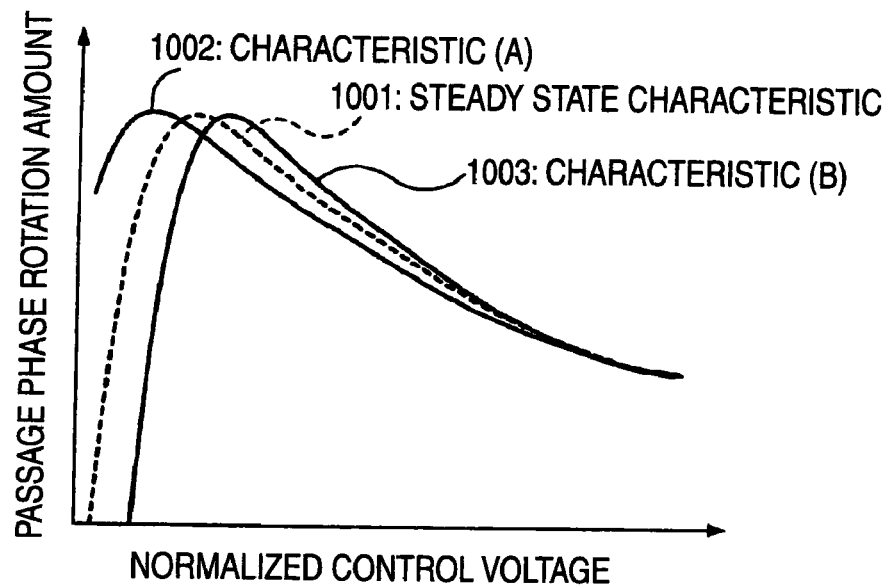
FIG. 11 shows AM-PM characteristic of the power amplifier.

In FIG. 11, the horizontal axis indicates the normalized control voltage and the vertical axis indicates the passage phase rotation amount of the power amplifier 1.

A steady state characteristic 1001 indicated by the dotted line indicates the steady state characteristic of the passage phase rotation amount relative to the normalized control voltage (AM-PM forward characteristic) and is the same as the steady state characteristic shown in FIG. 4 and the steady state characteristic 801 shown in FIG. 9.

A characteristic (A) 1002 indicated by the solid line indicates the forward characteristic of the AM-PM characteristic stored in the memory 102 to obtain phase information equal to the phase information after subjected to AM-PM characteristic compensation using the steady state characteristic 801 as an input signal to the phase modulation section 11 if the third coefficient information (coeff 3) satisfies expression (6).

A characteristic (B) 1003 indicated by the solid line indicates the forward characteristic of the AM-PM characteristic stored in the memory 102 to obtain phase information equal to the phase information after subjected to AM-PM characteristic compensation using the steady state characteristic 801 as an input signal to the phase modulation section 11 if the third coefficient information (coeff 3) satisfies expression (7).

Last, the AM-PM dynamic characteristic compensation method using the variable attenuation circuit 108 will be discussed with FIG. 11.

If the power level of the phase modulation signal output from the variable attenuation circuit 108 is set sufficiently high so that the power amplifier 1 is in a saturation operation state, the attenuation amount in the variable attenuation circuit 108 is finely adjusted, so that the AM-PM forward characteristic of the power amplifier 1 in the steady operation state can be changed from the steady state characteristic 1001 to the characteristic (A) 1002 or the characteristic (B) 1003 and a similar effect to that of adjusting the inverse characteristic stored in the memory 102 can be provided by adjusting the fourth coefficient information (coeff 4) without changing the inverse characteristic stored in the memory 102 as with the description of the AM-PM dynamic characteristic compensation method using the multiplication circuit 105b and the third coefficient selection section 107 or the AM-PM dynamic characteristic compensation method using the computation processing circuit 901 and the third coefficient selection section 107.

Five examples of the transmission level information, the amplitude information or the instantaneous amplitude value of the amplitude modulation signal, increase or decrease information between the preceding and following samples of the amplitude information or the instantaneous amplitude value of the amplitude modulation signal, the transmission frequency information, and the temperature information can be given as examples of the data D3 input to the third coefficient selection section 107. Four items of the transmission level information, the amplitude information or the instantaneous amplitude value of the amplitude modulation signal, the transmission frequency information, and the temperature information can be named as examples of the data D4 input to the fourth coefficient selection section 109.

Figure 12:
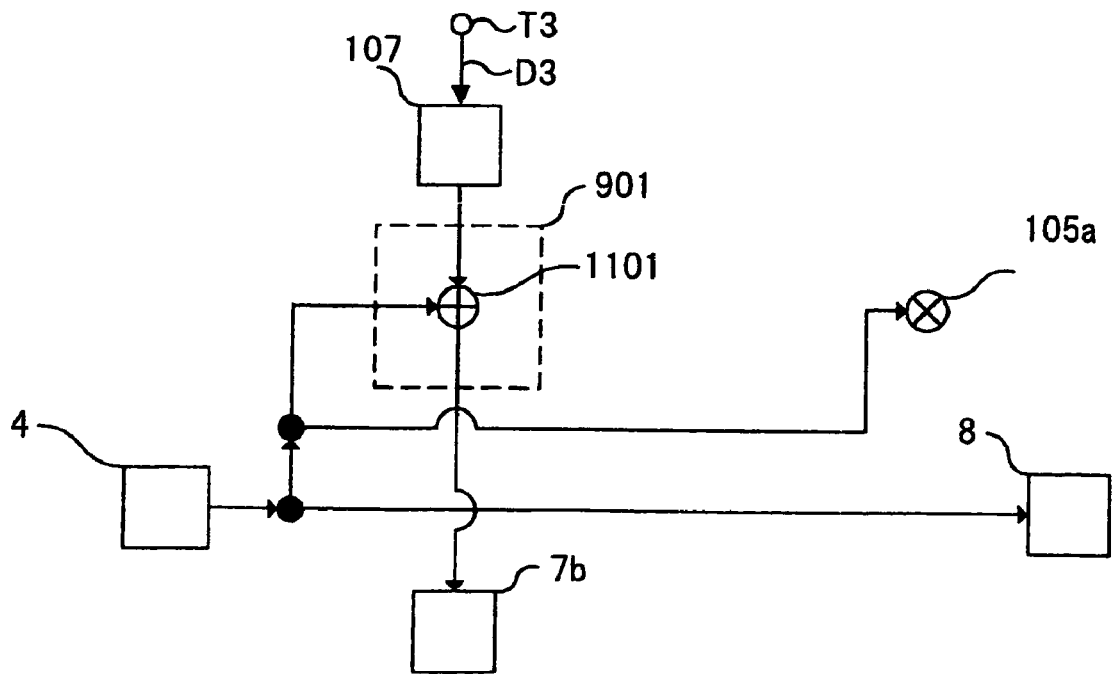
FIG. 12 is a diagram to show another example of the schematic configuration of the computation processing circuit.

A similar effect to that of the computation processing circuit 901 shown in FIG. 10 can also be provided by implementing the computation processing circuit 901 shown in FIG. 10 as an addition circuit 1101 shown in FIG. 12 and adding a predetermined value to the amplitude information output from the delay adjustment section 4 and the circuit scale can be further decreased. A similar effect can also be realized by performing the addition processing for the address signal output from the address generation section 7b rather than the signal input to the address generation section 7b. FIG. 12 shows only a peripheral circuit of a portion different from FIG. 2.

As described above, the polar modulation transmitter 1300 makes it possible to precisely compensate for the dynamic characteristic while suppressing an increase in the compensation data in the polar modulation system by multiplying the amplitude information after subjected to the amplitude correction by the coefficient information representing a transient response, performing the predetermined computation processing for the address signal at the AM-AM inverse characteristic referencing time in the steady state characteristic stored in the memory 102, performing the predetermined computation processing for the address signal at the AM-PM inverse characteristic referencing time in the steady state characteristic stored in the memory 102, and adjusting the input power level to the power amplifier 1 as for the AM-AM dynamic characteristic compensation using the AM-AM inverse characteristic in the steady state characteristic stored in the memory 102.

The two AM-AM dynamic characteristic compensation methods described above and the two AM-PM dynamic characteristic compensation methods described above have independent effects, of course, and can be used all in combination for realizing distortion compensation with furthermore high accuracy, needless to say.

Next, distortion compensation processing based on the adjustment operation for delay adjustment processing using the delay adjustment sections 4 and 5 will be discussed.

Figure 13:
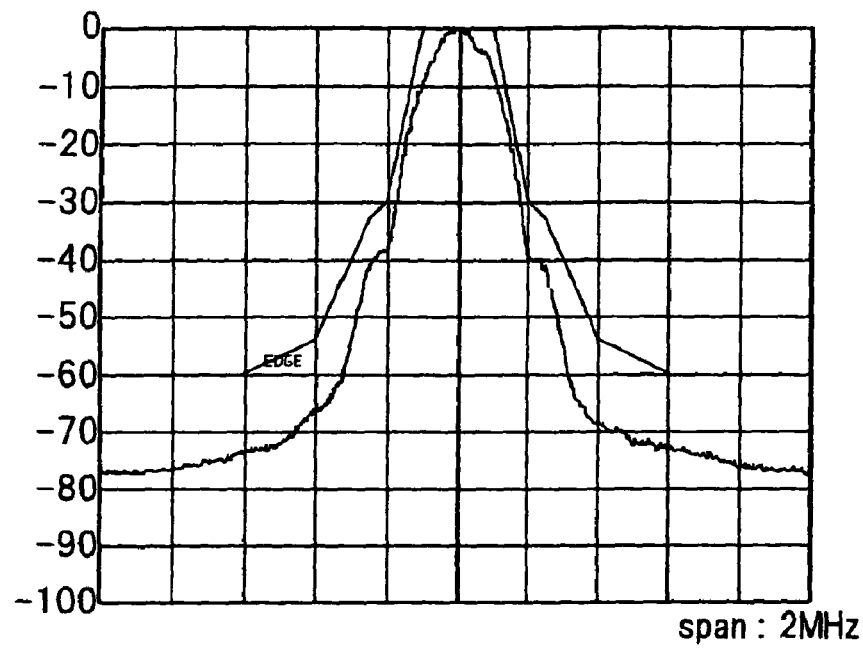
FIG. 13 is a drawing to show the effect of the polar modulation transmitter in the first embodiment of the invention (8-PSK modulation wave).

PD distortion compensation processing is performed using the polar modulation transmitter as described above, whereby a frequency spectrum as shown in FIG. 13 can be realized in output of the power amplifier 1 in an EDGE system. In FIG. 13, the horizontal axis indicates frequency and the vertical axis indicates the power level, the frequency spectrum characteristic of a modulation signal output from the power amplifier 1 when an 8-PSK modulation wave is used.

Here, in a study in the process to the invention, it was found that a better low distortion characteristic can be realized from the ACPR characteristic shown in FIG. 13 by adjusting the differential delay between amplitude information and phase information in response to the control voltage value input to the power amplifier 1 in a state in which the adjacent channel leakage power (ACPR: Adjacent Channel Power Ratio) is sufficiently decreased, namely, in a state in which AM-AM dynamic characteristic compensation and AM-PM dynamic characteristic compensation are realized with high accuracy.

Usually, to execute synchronization adjustment between amplitude information and phase information using the delay adjustment sections 4 and 5, the adjustment is executed so that a proper differential delay set at the circuit design time occurs between the amplitude information and the phase information. From a study of the inventor, it was found that the differential delay between an amplitude modulation signal and a phase modulation signal changes from the proper differential delay in response to the control voltage input to the power amplifier 1 because of parasitic capacitance relating to the amplitude modulation signal path and the phase modulation signal path of the transistor forming the power amplifier 1.

Then, the following four examples are given as data D5 input to the fifth coefficient selection section 1302:

To begin with, the following two examples exist as data relevant to the control voltage level of the power amplifier 1:

The first example is the transmission level information of the power amplifier 1 contained in the control signal D191 transmitted from the control section 1903 shown in FIG. 1.

The second example is the amplitude information input to the amplitude information correction section 8 or the instantaneous amplitude value of the amplitude modulation signal.

The following two examples exist as data relevant to the frequency relative difference between the amplitude modulation signal path and the phase modulation signal path.

The third example is the transmission frequency information contained in the control signal D191 transmitted from the control section 1903.

The fourth example is information concerning the modulation speed of a baseband transmission signal contained in the control signal D191 transmitted from the control section 1903 and input to the polar modulation section 2.

Therefore, the fifth coefficient selection section 1302 transmits fifth coefficient information (coeff 5) for adjusting the differential delay between the amplitude information and phase information paths to the delay adjustment sections 4 and 5 based on any of the four data pieces mentioned above and the delay adjustment sections 4 and 5 give a delay amount responsive to the fifth coefficient information to the amplitude information and the phase information, whereby a good low distortion characteristic can be realized.

The two AM-AM dynamic characteristic compensation methods described above and the two AM-PM dynamic characteristic compensation methods described above and the synchronization adjustment technique between the amplitude modulation signal and the phase modulation signal shown so far have independent effects, of course, and can be used all in combination for realizing distortion compensation with furthermore high accuracy, needless to say.

Next, a selection method of optimum coefficient information at the environmental temperature change time will be discussed. Specifically, a method of appropriately switching coefficient information to find the optimum value while monitoring the frequency spectrum of a modulation signal output from the power amplifier 1 using a measuring instrument such as a spectrum analyzer is shown.

Figure 14:
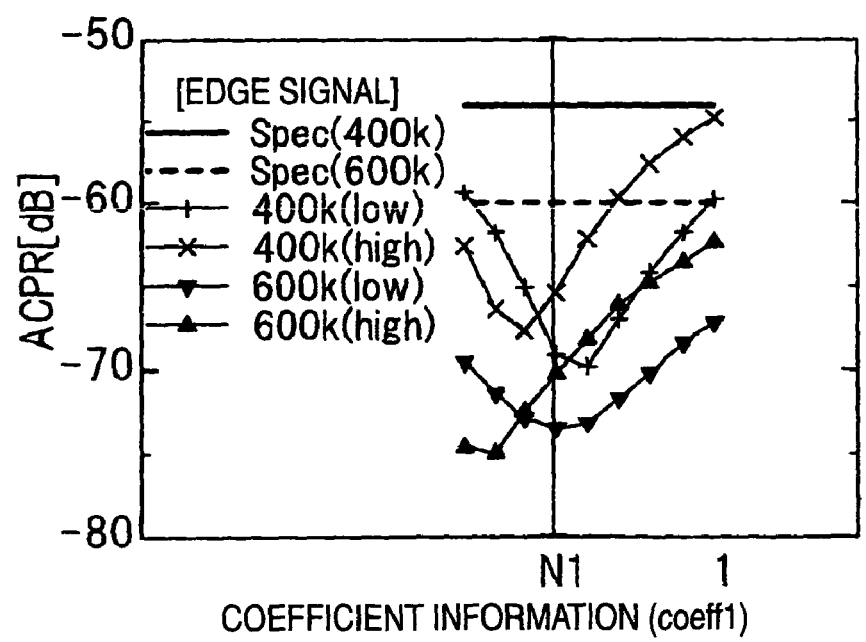
FIG. 14 is a drawing to show first coefficient information characteristic for ACPR characteristic.

FIG. 14 is a drawing to show first coefficient information (coeff 1) characteristic for the ACPR characteristic acquired using a spectrum analyzer when the polar modulation transmitter 1300 shown in FIG. 2 is set to a predetermined transmission level and an 8-PSK modulation wave is output. In FIG. 14, the horizontal axis indicates the first coefficient information and the vertical axis indicates the ACPR characteristic in output of the power amplifier 1 observed with the spectrum analyzer. For a breakdown of the ACPR specification at a 400-kHz detuning point and a 600-kHz detuning point defined in GSM/EDGE (proximity of maximum transmission level) and measurement values, see a legend in the figure. low denotes a lower frequency band and high denotes a upper frequency band. For example, the frequency spectrum shown in FIG. 13 is equivalent to the frequency spectrum of a modulation signal output from the power amplifier 1 when N1 (<1) is given as the first coefficient information in FIG. 14.

In another study in the process to the invention, the following three points were found:

The first point is as follows: It is made possible to bring close to the optimum spectrum by optimizing the first coefficient information so as to decrease the relative value (which will be hereinafter called unbalance) of the ACPR characteristic in the lower frequency band and the upper frequency band where the detuning frequency is the same value (for example, −400-kHz detuning point and +400-kHz detuning point) at the normal temperature.

The second point is as follows: FIG. 14 shows the ACPR characteristic at the normal temperature. It is made possible to bring close to the optimum spectrum at a predetermined temperature by optimizing the first coefficient information so as to decrease the unbalance of the ACPR characteristic although the absolute value of the ACPR characteristic and the value of the optimum point N1 shown in FIG. 14 change if the environmental temperature changes.

The third point is as follows: When distortion compensation processing is performed with the first coefficient information optimized at a predetermined temperature, if change is made to a different temperature, unbalance of the ACPR characteristic occurs.

Therefore, the ACPR characteristic in a predetermined band is measured for a modulation signal output from the power amplifier 1 and the first coefficient information is set so as to decrease the unbalance of the ACPR characteristic, whereby the optimum first coefficient information responsive to the temperature condition can be selected. Although the first coefficient information is used as the coefficient information in the description of the example, as for the second to third coefficient information, likewise, the optimum coefficient information responsive to the temperature condition can also be selected by setting the coefficient information so as to decrease the unbalance of the ACPR characteristic.

On the basis of the study result described above, the polar modulation transmitter of the embodiment includes the adaptive operation control section 1501 and makes it possible to select the optimum coefficient information responsive to the temperature condition, as shown in FIG. 1.

Figure 15:
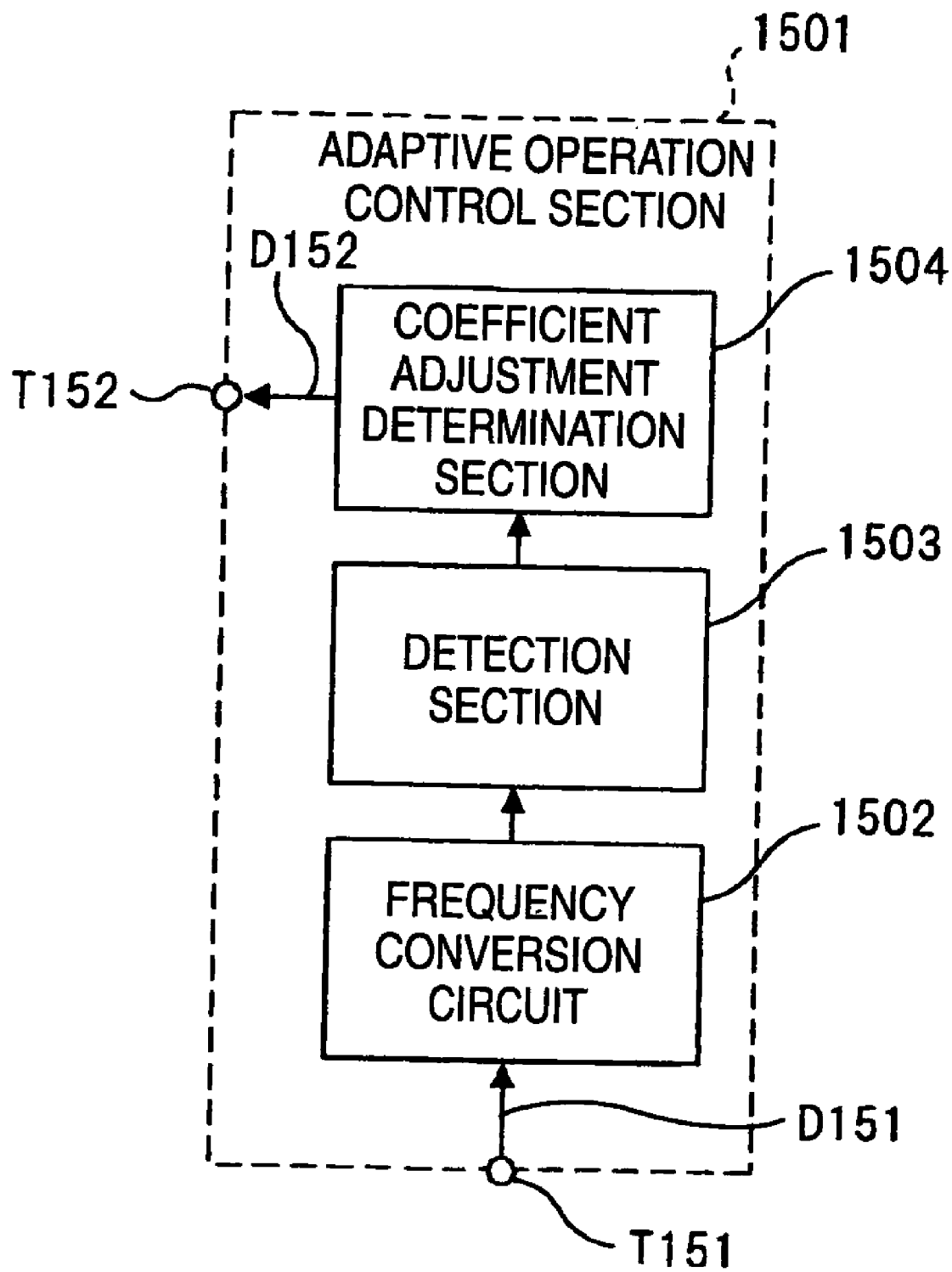
FIG. 15 is a diagram to show an example of an adaptive operation control section in the first embodiment of the invention.

FIG. 15 is a block diagram to show the schematic configuration of the adaptive operation control section according to the first embodiment of the invention. As shown in FIG. 15, the adaptive operation control section 1501 includes a frequency conversion circuit 1502, a detection section 1503, and a coefficient adjustment determination section 1504.

The frequency conversion circuit 1502 receives a modulation signal D151 in a wireless frequency band output from the power amplifier 1 through a signal output terminal T194 and a signal input terminal T151. It performs frequency conversion for the modulation signal D151 and decreases the frequency from the wireless frequency band to a frequency band that can be processed in the detection section 1503.

The detection section 1503 measures signal power (Pow_L and Pow_H) in the lower frequency band and the upper frequency band which become a predetermined identical detuning frequency from the center frequency of the modulation signal output from the frequency conversion circuit 1502. It transmits unbalance information ΔPow shown in expression (9) to the coefficient adjustment determination section 1504 based on Pow_L and Pow_H.

$$\Delta Pow = |Pow\_L - Pow\_H| \tag{9}$$

The coefficient adjustment determination section 1504 makes a comparison between a threshold value for the unbalance information ΔPow (ΔPow_Thresh), namely, the allowable value of the unbalance of the ACPR characteristic in output of the power amplifier 1 and ΔPow and if the unbalance information ΔPow is less than the threshold value, namely, expression (10) is satisfied, the coefficient adjustment determination section 1504 outputs a control signal D152 for maintaining the coefficient information of the first coefficient selection section 104 to the first coefficient selection section 104 through a signal output terminal T152 and the signal input terminal T1. On the other hand, if the unbalance information ΔPow is equal to or greater than the threshold value, namely, expression (11) is satisfied, the coefficient adjustment determination section 1504 outputs a control signal D152 for switching the coefficient information of the first coefficient selection section 104 to the first coefficient selection section 104 through the signal output terminal T152 and the signal input terminal T1. The reason why the coefficient information is switched only if the unbalance information ΔPow is equal to or greater than the threshold value is based on the fact that when distortion compensation processing is performed with the coefficient information optimized at a predetermined temperature, if change is made to a different temperature, a compensation error caused by the anti-temperature characteristic of the power amplifier 1 appears as unbalance of the ACPR characteristic and that the unbalance information ΔPow grows as the temperature change is larger.

$$\Delta Pow < \Delta Pow\_Thresh \quad (10)$$

$$\Delta Pow \geq \Delta Pow\_Thresh \quad (11)$$

Next, a switching method of the coefficient information will be discussed by taking the first coefficient information as an example.

The first coefficient selection section 104 stores the coefficient information in a one-to-one correspondence with the address number in the format shown in FIG. 5; it is assumed that address number M is selected in the initial state. Here, it is assumed that when the amplitude information input to the amplitude information correction section 8 or the instantaneous amplitude value of the amplitude modulation signal is used as the data D1, the address initial number is the address number corresponding to the average value of the amplitude information or the instantaneous amplitude value of the amplitude modulation signal.

It is assumed that when the transmission level information or the transmission frequency information of the power amplifier 1 contained in the control signal D191 transmitted from the control section 1903 is used as the data D1, the address initial number is the address number for giving the first coefficient information optimum at the normal temperature. Although the adaptive operation control section 1501 can be used to realize characteristic compensation at the temperature change time in a similar manner to that of using the temperature information contained in the control signal D192 from the temperature sensor 1904 as the data D1, the temperature compensation may be made only using the adaptive operation control section 1501 or may be made using both the temperature information contained in the control signal D192 from the temperature sensor 1904 and the adaptive operation control section 1501, needless to say.

The first coefficient selection section 104 receives the control signal D152 transmitted from the coefficient adjustment determination section 1504 as the data D1 through the signal output terminal T152 and the signal input terminal T1 and if the received control signal D152 is a control signal for switching the coefficient information, the first coefficient selection section 104 selects either of the address numbers preceding and following the current selected address number.

An example of selecting the address number by trial and error is given below:

To begin with, if address number (M+1) is selected and the anti-temperature characteristic of the power amplifier 1 can be compensated for with good accuracy according to the first coefficient information output from the first coefficient selection section 104, the unbalance information ΔPow as the measurement result in the detection section 1503 can be decreased to less than ΔPow_Thresh and thus the coefficient adjustment determination section 1504 outputs a control signal D152 for maintaining the current selected address number to the first coefficient selection section 104.

If the unbalance information ΔPow is equal to or greater than ΔPow_Thresh although it is improved, the address number is changed in the same direction as the direction when the address number of the initial value is changed to the following address number. That is, address number (M+2) is selected. The process is repeated in a similar manner until the unbalance information ΔPow becomes less than ΔPow_Thresh.

On the other hand, if address number (M+1) is selected and the unbalance information ΔPow is degraded more than the initial value of the unbalance information ΔPow, the address number is changed in the opposite direction to the direction when the address number of the initial value is changed to the following address number. At this point in time, if the unbalance information ΔPow can be decreased to less than ΔPow_Thresh, the coefficient adjustment determination section 1504 outputs a control signal D6 for maintaining the current selected address number to the first coefficient selection section 104. At this point in time, if the unbalance information ΔPow is equal to or greater than ΔPow_Thresh, the address number is changed in the same direction as the direction when the address number of the initial value is changed to the current maintained address number. That is, address number (M−2) is selected. The process is repeated in a similar manner until the unbalance information ΔPow becomes less than ΔPow_Thresh.

Figure 16:
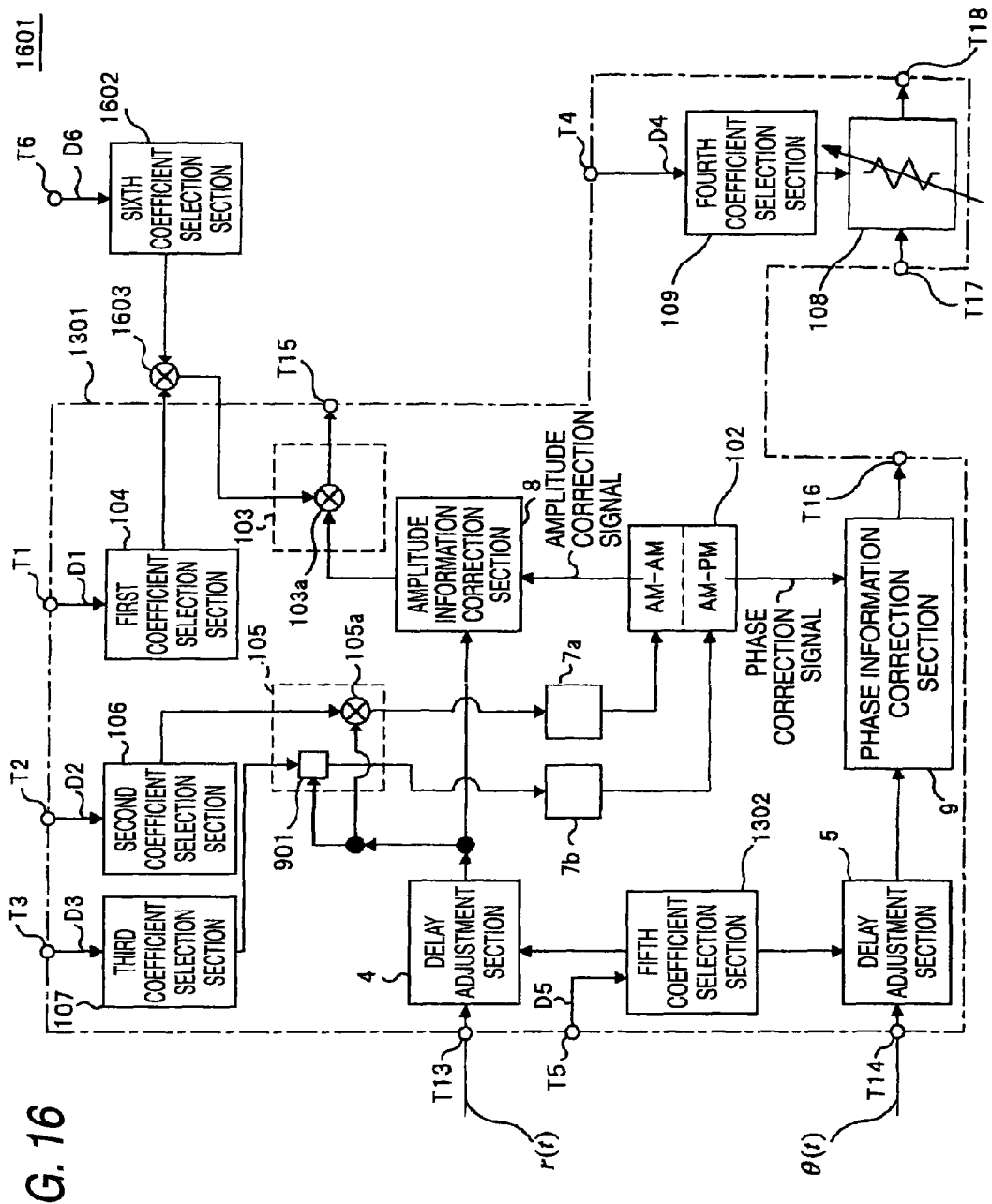
FIG. 16 is a diagram to show another example of a distortion compensation processing circuit in the first embodiment of the invention.

If sufficient compensation accuracy cannot be provided according to the adjustment step width that can be realized in the first coefficient selection section 104, a configuration shown in FIG. 16 can adopted for narrowing the adjustment step width and improving the compensation accuracy.

FIG. 16 is a diagram to show another example of the distortion compensation processing circuit according to the first embodiment of the invention. As shown in FIG. 16, a distortion compensation processing circuit 1601 has the distortion compensation processing circuit 1301 and a signal input terminal T6 and includes a sixth coefficient selection section 1602 and a multiplication circuit 1603 operating as an example of a distortion compensation adjustment section. That is, the distortion compensation processing circuit 1601 shown in FIG. 16 newly includes the sixth coefficient selection section 1602 having the signal input terminal T6 and the multiplication circuit 1603 in addition to the distortion compensation processing circuit 1301 shown in FIG. 2, and multiplies first coefficient information output from the first coefficient selection section 104 by sixth coefficient information (coeff 6) output from the sixth coefficient selection section 1602 by the multiplication circuit 1603. In the example in FIG. 16, different data is input to the signal input terminal T1 and the signal input terminal T6. That is, the transmission level information or the transmission frequency information of the power amplifier 1 contained in the control signal D191 transmitted from the control section 1903, the amplitude information input to the amplitude information correction section 8 or the instantaneous amplitude value of the amplitude modulation signal, and the temperature information contained in the control signal D192 from the temperature sensor 1904 are input to the signal input terminal T1, and the control signal D152 transmitted from the coefficient adjustment determination section 1504 is input to the signal input terminal T6.

The sixth coefficient selection section 1602 stores the sixth coefficient information (coeff 6) in a format shown in FIG. 17. The first column of the table data shown in FIG. 17 indicates the address numbers of table data and the second column indicates the sixth coefficient information (coeff 6) in a predetermined range containing 1. In the example, coefficient information 1 is stored in the address number Q and the coefficient information is set so as to monotonously decrease with an increase in the address number in such a manner that the coefficient information corresponding to the address number smaller than Q is greater than 1 and the coefficient information corresponding to the address number greater than Q is smaller than 1.

The sixth coefficient selection section 1602 outputs 1 in the initial state among the output coefficient information (coeff 6) pieces shown in FIG. 17. That is, the address number Q is selected. It is assumed that the first coefficient selection section 104 selects the address number M based on the data D1 input to the signal input terminal T1.

If the sixth coefficient selection section 1602 receives a control signal for switching the coefficient information at the signal input terminal T6 as the control signal D152 output from the coefficient adjustment determination section 1504, it selects either of the address numbers preceding and following the current selected address number. The specific selection operation is similar to that described as for the first coefficient information selection section 104 and will not be discussed again.

While the coefficient information switching method has been described by taking the first coefficient information as an example, any of the second to fifth coefficient information is switched so as to decrease the unbalance of the modulation signal output from the power amplifier 1 as with the switching method of the first coefficient information, whereby optimum coefficient information dealing with the environment variation of the temperature condition, etc., can be selected. The compensation accuracy can be improved by applying a circuit for narrowing the adjustment step width such as the sixth coefficient selection section 1602 to the second coefficient selection section 106, the third coefficient selection section 107, the fourth coefficient selection section 109, or the fifth coefficient selection section 1302 as the compensation accuracy is improved by applying the sixth coefficient selection section 1602 to the first coefficient selection section 104.

In the simulation result in adjusting the differential delay between amplitude information and phase information formerly performed, unbalance of a frequency spectrum does not occur and an equal degradation degree results if the amplitude signal and the phase signal are intentionally placed out of synchronization because of execution of compensation for the ideal AM-AM dynamic characteristic and AM-PM dynamic characteristic, as shown in FIG. 6 or FIG. 7 of "Proposal of Transmitter Architecture for Mobile Terminals employing EER Power Amplifier" described in Vehicular Technology Conference, 2003. VTC 2003-Spring. The 57th IEEE Semiannual (p. 1327-1330 vol. 2). In an experiment using a device, if the AM-AM dynamic characteristic and the AM-PM dynamic characteristic are not compensated for with sufficient accuracy, a dominant ACPR characteristic degradation factor exists in addition to loss of synchronization between amplitude information and phase information and an unbalance caused by loss of synchronization. Therefore, the method of adjusting the differential delay between the amplitude information and phase information paths so as to decrease the unbalance is made clear in the study in the process to the invention.

As described above, according to the first embodiment of the invention, there can be provided the polar modulation transmitter that can realize adaptive distortion compensation processing without increasing the circuit scale of the synchronization adjustment circuit as the problem in the related art for realizing adaptive distortion compensation processing by making a comparison between a baseband transmission signal and a modulation signal output from the power amplifier 1.

A similar effect can be provided if the measurement function of a spectrum analyzer is used in place of the frequency conversion circuit 1502 and the detection section 1503 and a similar effect can be provided if coefficient adjustment of the first coefficient selection section 104 based on the measurement result of the detection section 1503 or the sixth coefficient selection section 1601 is manually made based on the measurement result displayed on a screen of the spectrum analyzer, needless to say.

The polar modulation transmitter 1300, the adaptive operation control section 1501, and a combination thereof, or the wireless communication apparatus transmission section 1900 can be implemented as an integrated circuit as they are formed on a silicon semiconductor substrate, for example.

Second Embodiment

A second embodiment of the invention describes a technology of performing the adaptive distortion compensation processing described in the first embodiment of the invention via a wireless link between a mobile station wireless communication apparatus and a base station wireless communication apparatus.

The adaptive distortion compensation processing technology is characterized by the fact that a base station wireless communication apparatus includes a detection section of a modulation signal output from a power amplifier forming a part of a mobile station wireless communication apparatus, that the mobile station wireless communication apparatus includes a coefficient adjustment determination section for updating distortion compensation data of the mobile station wireless communication apparatus based on the measurement result of the detection section, and that the control information amount involved in adaptive operation control is decreased, and can realize adaptive operation control via a wireless link.

Figure 18:
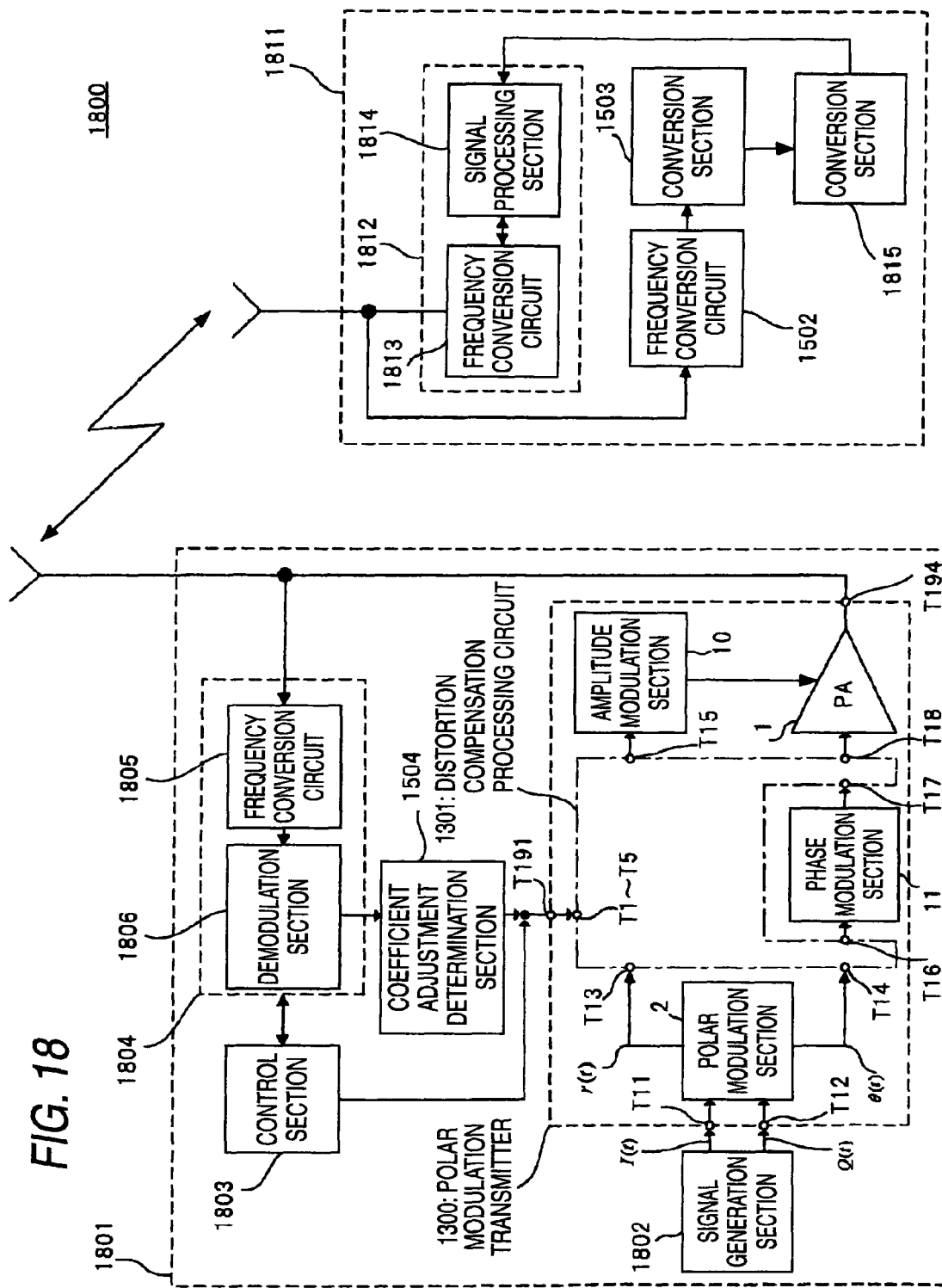
FIG. 18 is a diagram to show the schematic configuration of an adaptive distortion compensation processing system in a second embodiment of the invention.

FIG. 18 is a diagram to show the schematic configuration of an adaptive distortion compensation processing system in the second embodiment of the invention.

As shown in FIG. 18, an adaptive distortion compensation processing system 1800 includes a mobile station wireless communication apparatus 1801 and a base station wireless communication apparatus 1811, wherein the mobile station wireless communication apparatus 1801 and the base station wireless communication apparatus 1811 transmit and receive data via a wireless link. The mobile station wireless communication apparatus 1801 includes the polar modulation transmitter 1300 shown in FIG. 2, a signal generation section 1802, a control section 1803, and a mobile station receiver 1804. The polar modulation transmitter 1300 is already described in the first embodiment and therefore will not be discussed again. See the detailed description using FIG. 2 in the first embodiment. FIG. 18 shows components relevant to the following description as the components of the polar modulation transmitter 1300.

To begin with, the operation of the mobile station wireless communication apparatus 1801 will be discussed:

The signal generation section 1802 generates a baseband orthogonal coordinate signal (IQ signal) from transmission data transmitted to the associated base station wireless communication apparatus 1811 based on user operation of the mobile station wireless communication apparatus 1801, and transmits the IQ signal to the polar modulation section 2.

The control section 1803 controls the operation of the polar modulation transmitter 1300 and the mobile station receiver 1804. A control signal involved in distortion compensation processing, of control signals output to the polar modulation transmitter 1300 is transmission level information and is input to the first coefficient selection section 104, the second coefficient selection section 106, the third coefficient selection section 107, the fourth coefficient selection section 109, or the fifth coefficient selection section 1302 through the signal input terminal T191 and the signal input terminals T1 to T5.

The mobile station receiver 1804 includes a frequency conversion circuit 1805 and a demodulation section 1806.

The frequency conversion circuit 1805 receives a modulation signal transmitted from the base station wireless communication apparatus 1811, converts the modulation signal in a wireless frequency band into a baseband frequency, and outputs the signal to the demodulation section 1806.

The demodulation section 1806 reproduces the transmission data generated in the base station wireless communication apparatus 1811 based on the reception signal output from the frequency conversion circuit 1805. It also outputs unbalance information ($\Delta$Pow2) of the out-of-band spectrum of the modulation signal output from the mobile station wireless communication apparatus 1801, measured in the base station wireless communication apparatus 1811, contained in the transmission data to the coefficient adjustment determination section 1504. A generation method of the unbalance information ($\Delta$Pow2) in the base station wireless communication apparatus 1811 is described later.

The coefficient adjustment determination section 1504 makes a comparison between a threshold value for $\Delta$Pow2 ($\Delta$Pow2_Thresh), namely, the allowable value of the unbalance of the ACPR characteristic in the output part of the power amplifier 1 forming a part of the polar modulation transmitter 1300 and the unbalance information ($\Delta$Pow2) and if the unbalance information $\Delta$Pow2 is less than the threshold value, namely, expression (12) is satisfied, the coefficient adjustment determination section 1504 outputs a control signal for maintaining the coefficient information of the Nth coefficient selection section (N is any one of 1 to 5) to the Nth coefficient selection section through the signal input terminal T191 and the signal input terminals T1 to T5. On the other hand, if the unbalance information $\Delta$Pow2 is equal to or greater than the threshold value, namely, expression (13) is satisfied, the coefficient adjustment determination section 1504 outputs a control signal for switching the coefficient information of the Nth coefficient selection section to the Nth coefficient selection section through the signal input terminal T191 and the signal input terminals T1 to T5. The reason why the coefficient information is switched only if the unbalance information $\Delta$Pow2 is equal to or greater than the threshold value is based on the fact that when distortion compensation processing is performed with the coefficient information optimized at a predetermined temperature, if change is made to a different temperature, a compensation error caused by the anti-temperature characteristic of the power amplifier 1 appears as unbalance of the ACPR characteristic and that the unbalance information $\Delta$Pow grows as the temperature change is larger.

$$\Delta Pow2 < \Delta Pow2\_Thresh \quad (12)$$

$$\Delta Pow2 \geq \Delta Pow2\_Thresh \quad (13)$$

Here, a method of switching the coefficient information by trial and error as shown in the first embodiment of the invention is available as an example of the switching method of the coefficient information of the Nth coefficient selection section if the unbalance information $\Delta$Pow2 is equal to or greater than the threshold value.

While the mobile station wireless communication apparatus 1801 having the distortion compensation processing circuit 1301 shown in FIG. 2 has been described, the mobile station wireless communication apparatus 1801 may be implemented using the distortion compensation processing circuit 1601 shown in FIG. 16; to replace the distortion compensation processing circuit 1301 with the distortion compensation processing circuit 1601, the transmission level information of the control signals output from the control section 1803 is input to the Nth coefficient selection section through the signal input terminals T1 to T5 and the control signal output from the coefficient adjustment determination section 1504 is input to the sixth coefficient selection section through the signal input terminal T6.

Next, the operation of the base station wireless communication apparatus 1811 will be discussed.

The base station wireless communication apparatus 1811 includes a base station transceiver 1812, a frequency conversion circuit 1502, a detection section 1503, and a conversion section 1815.

The base station transceiver 1812 includes a frequency conversion circuit 1813 and a signal processing section 1814.

At the reception operation time, the frequency conversion circuit 1813 receives a transmission modulation signal from the mobile station wireless communication apparatus 1801 through an antenna, converts the modulation signal in a wireless frequency band into a baseband frequency, and outputs the signal to the signal processing section 1814. At the transmission operation time, the frequency conversion circuit 1813 converts a baseband frequency signal output from the signal processing section 1814 into a wireless frequency band and transmits the wireless frequency signal to the mobile station wireless communication apparatus through the antenna.

At the reception operation time, the signal processing section 1814 reproduces the transmission data generated in the mobile station wireless communication apparatus 1801 from the baseband frequency signal output from the frequency conversion circuit 1813. At the transmission operation time, the signal processing section 1814 generates a transmission signal to be transmitted to the associated mobile station wireless communication apparatus 1801 based on a request received from the mobile station wireless communication apparatus 1801 and a signal output from the conversion section 1815 and outputs a baseband frequency signal to the frequency conversion circuit 1813.

The frequency conversion circuit 1502 executes frequency conversion of the wireless frequency signal transmitted from the mobile station wireless communication apparatus 1801, received through the antenna and decreases the frequency from the wireless frequency band to the frequency band that can be processed in the detection section 1503.

The detection section 1503 measures signal power (Pow3_L and Pow3_H) in the lower frequency band and the upper frequency band which become a predetermined identical detuning frequency from the center frequency of the modulation signal from the modulation signal output from the frequency conversion circuit 1502 placed at the preceding stage like the operation of the detection section 1503 shown in FIG. 15. It transmits unbalance information ΔPow3 shown in expression (14) to the conversion section 1815 based on Pow3_L and Pow3_H.

$$\Delta Pow3 = Pow3\_L - Pow3\_H \tag{14}$$

The conversion section 1815 converts the unbalance information ΔPow3 output from the detection section 1503 into a discrete value at a predetermined interval, performs bit assignment processing suited to a predetermined transmission signal format to the discrete value, and outputs the bit information (which will be hereinafter called CAL bits) to the signal processing section 1814 as an operation control signal of the adaptive distortion compensation operation of the polar modulation transmitter 1300 forming a part of the associated mobile station wireless communication apparatus 1801. The specific processing of the conversion section 1815 is described later. Next, a generation method of the unbalance information converted into the discrete value, of the specific processing of the conversion section 1815 will be discussed by taking the case where the step width of the discretization is set to N[dB] as an example.

To begin with, the conversion section 1815 extracts only a quotient of K1 found from expression (15) for the unbalance information ΔPow3 output from the detection section 1503. Here, the quotient is K2 and a remainder is K3. Next, expression (16) is calculated, whereby unbalance information ΔPow2 discretized to the N[dB] step width is found.

$$K1 = \Delta Pow3/N = K2 + K3 \tag{15}$$

$$\Delta Pow2 = (K2-1)*N \tag{16}$$

Next, the bit assignment processing suited to the predetermined transmission signal format to the unbalance information ΔPow2 will be discussed.

Figure 19:
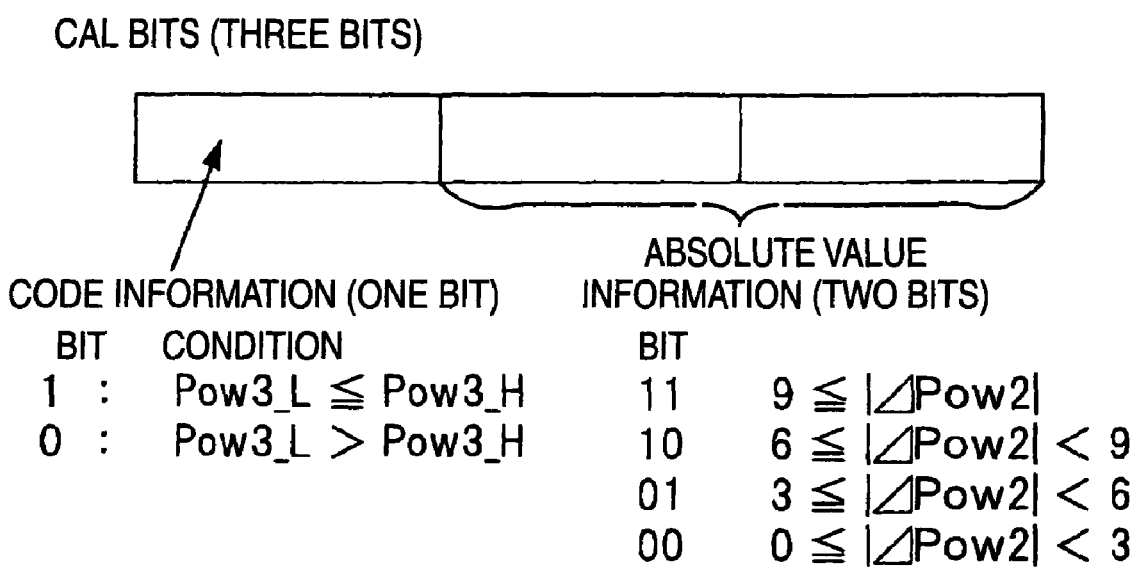
FIG. 19 is a drawing to show an example of CAL bits in the second embodiment of the invention.

FIG. 19 shows an example of generating CAL bits from the unbalance information ΔPow2 discretized at N=3, namely, the 3[dB] step width.

In this example, two bits are assigned to absolute value information of the unbalance information ΔPow2 and one bit is assigned to code information of the unbalance information ΔPow2. That is, the three bits represent the unbalance information. The number of bits that can be assigned varies from one assumed wireless system to another.

As the system is configured as described above, it is made possible to feed back the ACPR characteristic acquisition result of the output spectrum of the power amplifier 1 in the base station wireless communication apparatus 1811 into the polar modulation transmitter 1300 forming a part of the mobile station wireless communication apparatus 1801 through the wireless link. Accordingly, new problems of the loss caused by branching the output signal of the power amplifier 1 and shortening of the telephone conversion time and the data communication time of the mobile station wireless communication apparatus caused by an increase in the consumption current in the acquisition part of the ACPR characteristic occurring in the first embodiment wherein the frequency conversion circuit 1502 and the detection section 1503 are provided in the mobile station wireless communication apparatus can be solved.

Third Embodiment

A third embodiment of the invention describes a technology of realizing predistortion compensation processing of a multimode wireless communication apparatus while suppressing an increase in the distortion compensation processing data capacity and an increase in the circuit scale of a distortion compensation processing circuit.

The multimode predistortion compensation processing technology will be discussed using a polar modulation transmitter shown in FIG. 20.

Figure 20:
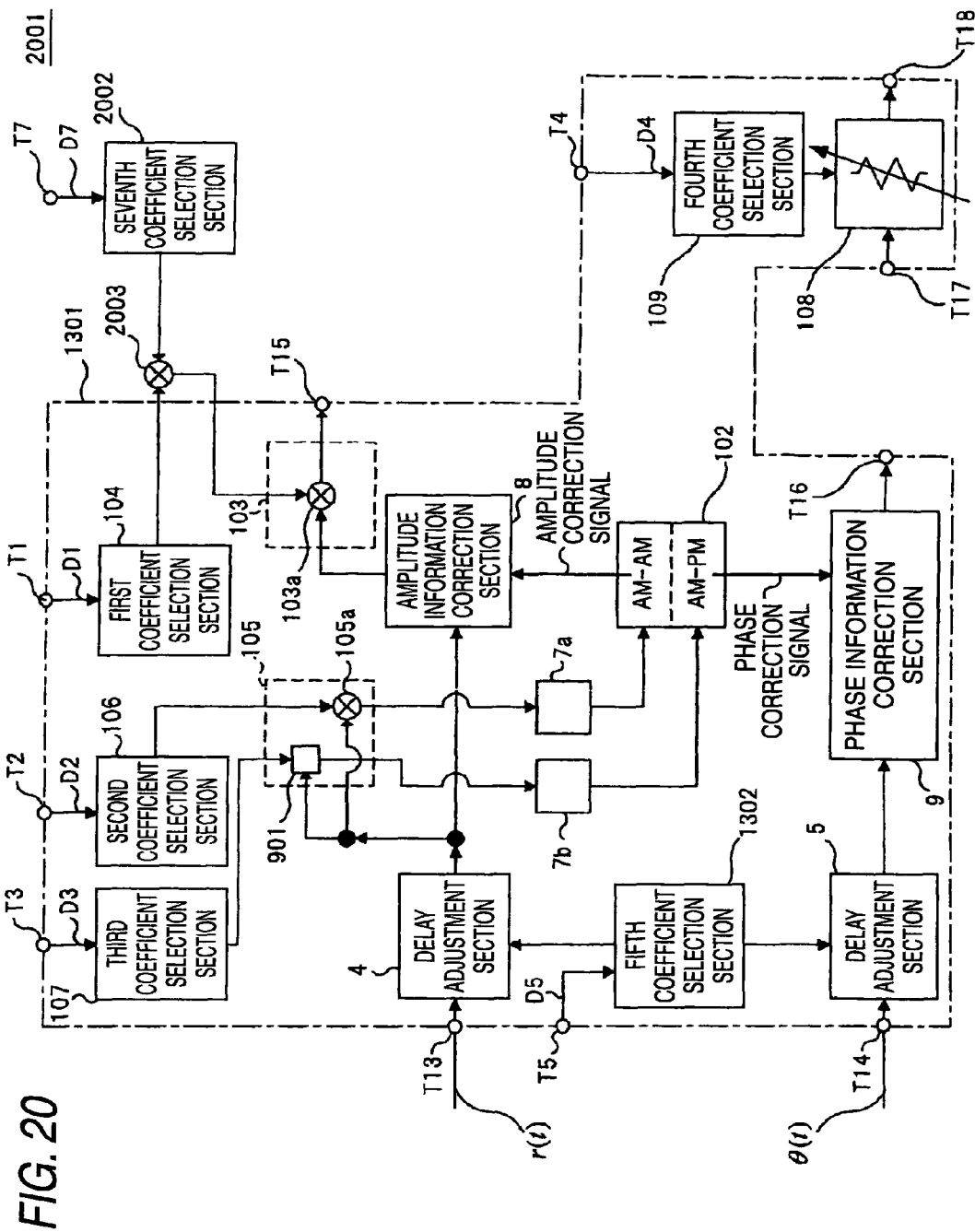
FIG. 20 is a diagram to show an example of a distortion compensation processing circuit in a third embodiment of the invention.

As shown in FIG. 20, a distortion compensation processing circuit 2001 includes the distortion compensation processing circuit 1301, a seventh coefficient selection section 2002 having a signal input terminal T7 and operating as an example of a distortion compensation adjustment section, and a multiplication circuit 2003.

That is, the distortion compensation processing circuit 2001 newly includes the seventh coefficient selection section 2002 having the signal input terminal T7 and the multiplication circuit 2003 in addition to the distortion compensation processing circuit 1301 shown in FIG. 2, and multiplies first coefficient information output from the first coefficient selection section 104 by seventh coefficient information (coeff 7) output from the seventh coefficient selection section 2002 by the multiplication circuit 2003.

Here, the components of the distortion compensation processing circuit 1301 described with FIG. 2 or FIG. 16 in the first embodiment of the invention will not be discussed again.

The seventh coefficient selection section 2002 stores the seventh coefficient information (coeff 7) in a format shown in FIG. 21. The first column of the table data shown in FIG. 21 indicates the address numbers of table data and the second column indicates the seventh coefficient information (coeff 7) in a predetermined range containing 1. In the example, coefficient information 1 is stored in the address number 3 and the coefficient information is set so as to monotonously decrease with an increase in the address number in such a manner that the coefficient information corresponding to the address number smaller than 3 is greater than 1 and the coefficient information corresponding to the address number greater than Q is smaller than 1.

Upon reception of modulation speed data D7 as information for identifying the type of currently transmitted modulation signal, separated for each predetermined range as shown in FIG. 22, contained in a control signal D191 output from a control section 1903 through the signal input terminal T7, the seventh coefficient selection section 2002 references the address number corresponding to the modulation speed data D7 and selects the seventh coefficient information. Here, the first column of the table data shown in FIG. 22 indicates the modulation speed range and the second column indicates the address number in referencing the stored data in the seventh coefficient selection section 2002 shown in FIG. 21.

It is assumed that the first coefficient selection section 104 selects the address number M based on the data D1 illustrated in the first embodiment of the invention input to the signal input terminal T1, specifically the transmission level information or the transmission frequency information of the power amplifier 1 contained in the control signal D191 transmitted from the control section 1903, the amplitude information input to the amplitude information correction section 8 or the instantaneous amplitude value of the amplitude modulation signal, and the temperature information contained in the control signal D192 from the temperature sensor 1904.

In the study in the process to the invention, it was found that when data D2 to data D5 input to the signal input terminals T2 to T5 as well as the data D1 input to the signal input terminal T1 are based on the same information, the seventh coefficient information (coeff 7) to obtain the optimum point of the ACPR characteristic of the modulation signal output from the power amplifier 1 becomes a smaller value if the modulation speed increases.

Figure 23:
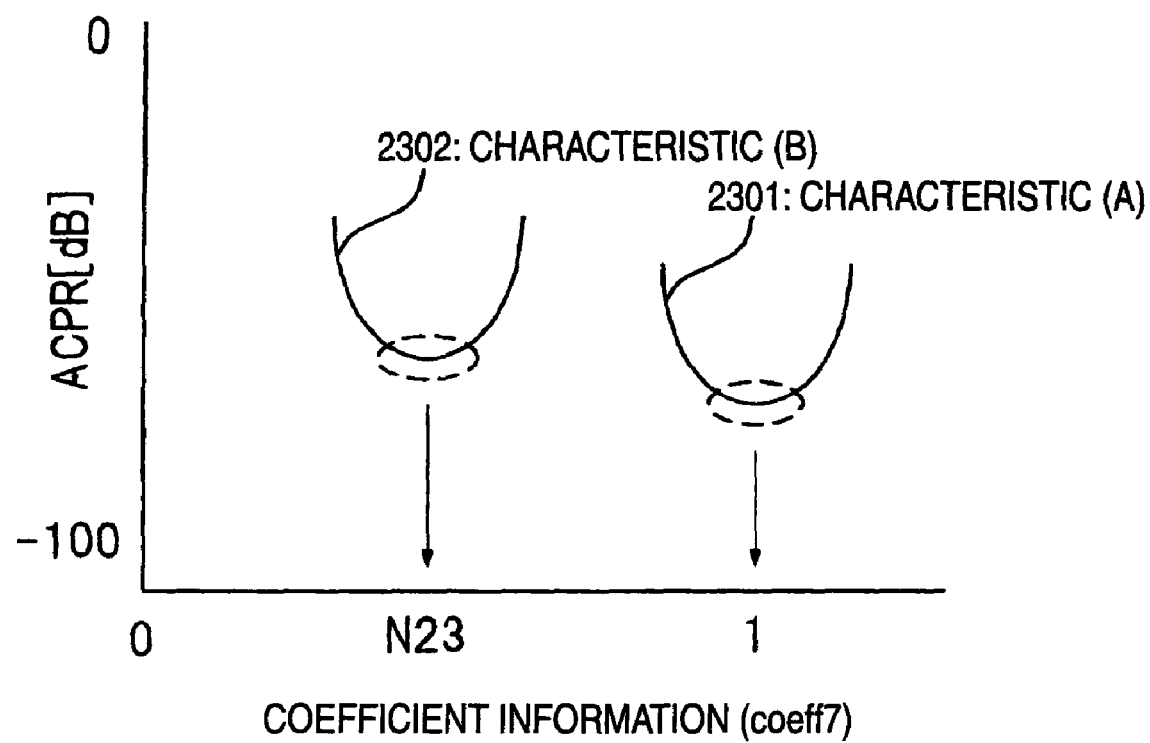
FIG. 23 is a drawing to show the relationship between modulation speed and optimum seventh coefficient information.

FIG. 23 is a drawing to show the ACPR characteristics for the modulation signals having different modulation speed. In FIG. 23, the horizontal axis indicates the seventh coefficient information and the vertical axis indicates the ACPR value.

A characteristic (A) 2301 is an ACPR characteristic acquired by sweeping only the seventh coefficient information when an EDGE system 8-PSK modulation signal is used.

A characteristic (B) 2302 is an ACPR characteristic acquired by sweeping only the seventh coefficient information when a WCDMA system modulation signal is used, for example, as a higher-speed modulation signal than the 8-PSK modulation signal.

The ACPR characteristics shown in FIG. 23 are provided by extracting worse characteristics of the ACPR characteristics in a lower frequency band and a upper frequency band.

In the fourth embodiment of the invention, considering the seventh coefficient information when the EDGE system 8-PSK modulation signal is used as the reference, the table data in FIG. 21 and the table data in FIG. 22 are set so as to output the seventh coefficient information corresponding to the modulation speed data D7 when transmission is executed at the modulation speed of the 8-PSK modulation signal (about 270 k), but the definition method of the stored data in the table data should be changed depending on the assumed multimode signal, the required compensation accuracy, etc., needless to say.

As described above, since the optimum value of the seventh coefficient information varies depending on the modulation speed, the distortion compensation processing circuit 2001 according to the third embodiment of the invention switches the seventh coefficient information based on the information representing the modulation speed.

As the system is configured as described above, an effect equivalent to providing distortion compensation processing data of the power amplifier 1 stored in the memory 102 for each modulation signal is realized and the predistortion compensation processing of the multimode wireless communication apparatus can be realized while an increase in the distortion compensation processing data capacity and an increase in the circuit scale of the distortion compensation processing circuit are suppressed.

The polar modulation transmitter that can realize adaptive distortion compensation processing can be provided by adding the adaptive operation control section 1501 shown in FIG. 15 to the distortion compensation processing circuit 2001 and inputting the data D152 output from the coefficient adjustment determination section 1504 through the signal output terminal T152 to the first coefficient selection section 104 as the data D1 through the signal input terminal T1 or by adding the adaptive operation control section 1501 shown in FIG. 15, the sixth coefficient selection section 1602 having the signal input terminal T6 shown in FIG. 16, and the multiplication circuit 1603 to the distortion compensation processing circuit 2001, multiplying the product of the first coefficient information and the seventh coefficient information output from the multiplication circuit 2003 by the sixth coefficient information (coeff 16) output from the sixth coefficient selection section 1602 by the multiplication circuit 1603, and inputting the data D152 output from the coefficient adjustment determination section 1504 through the signal output terminal T152 to the sixth coefficient selection section 1602 through the signal input terminal T6.

The polar modulation transmitter according to the third embodiment of the invention can be implemented as an integrated circuit as it is formed on a silicon semiconductor substrate, for example. In this case, it is also possible to form the polar modulation transmitter with the function blocks each for each substrate.

Fourth Embodiment

Figure 24:
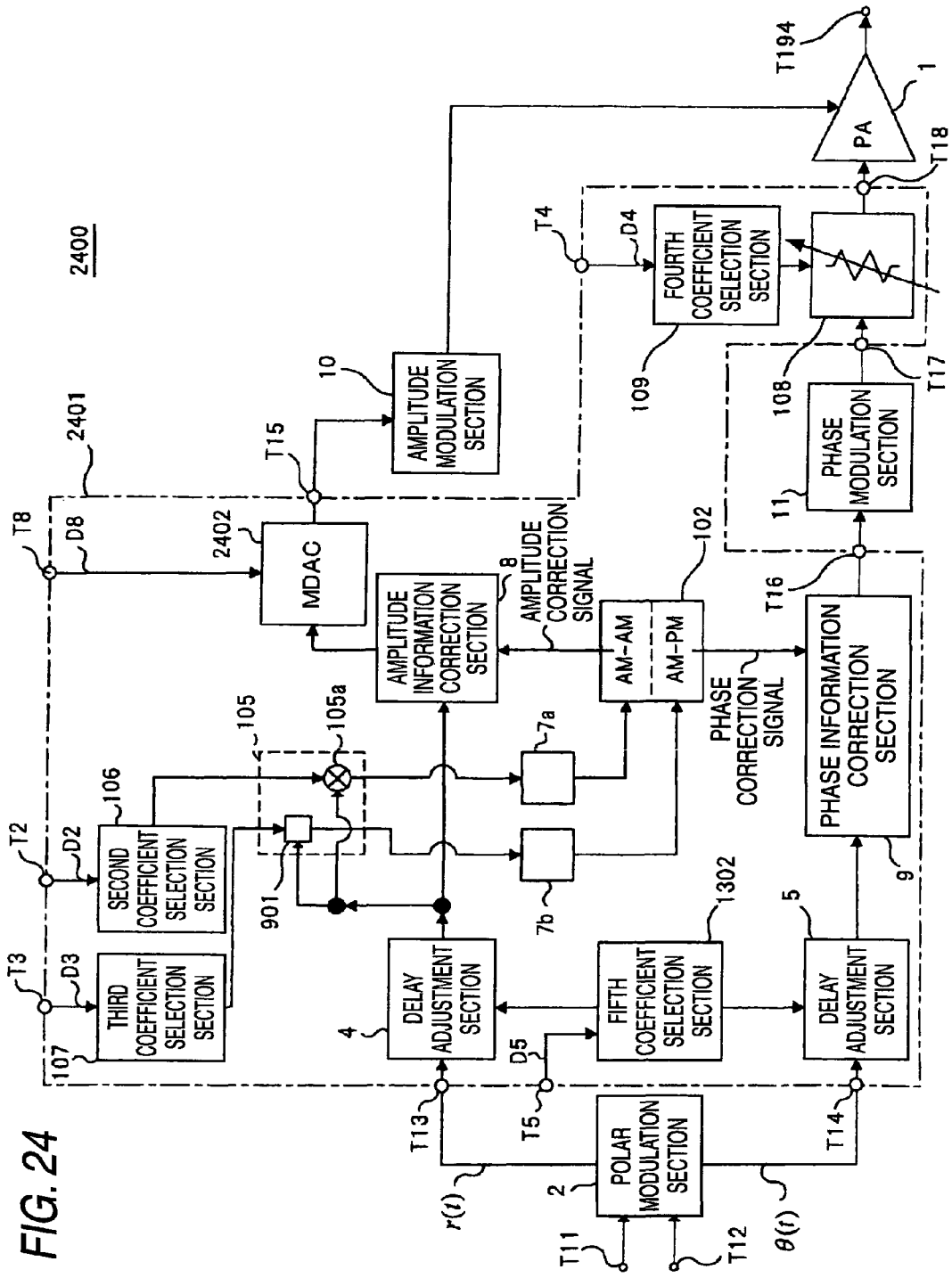
FIG. 24 is a diagram to show an example of a polar modulation transmitter in a fourth embodiment of the invention.

FIG. 24 is a block diagram to show the schematic configuration of a polar modulation transmitter according to a fourth embodiment of the invention. Parts duplicate with those described with FIG. 2 in the first embodiment are denoted by the same reference numerals in FIG. 24 and will not be discussed again.

As shown in FIG. 24, a polar modulation transmitter 2400 of the fourth embodiment includes a distortion compensation processing circuit 2401 having a multiplying DAC (hereinafter, abbreviated as MDAC) 2402 to which a signal D8 is input through a signal input terminal T8, provided between the amplitude information correction section 8 and a signal output terminal T15 to an amplitude modulation section 10.

To implement the wireless communication apparatus transmission section as shown in FIG. 1 using the polar modulation transmitter 1300 shown in FIG. 2, it is a common practice to place a digital-analog conversion circuit (hereinafter, abbreviated as DAC) not shown between the first amplitude information adjustment section 103 and the amplitude modulation section 10 and between the amplitude information correction section 8 and the phase modulation section 11 in FIG. 2.

Then, in the polar modulation transmitter 2400 according to the fourth embodiment of the invention, the MDAC for performing multiplication processing of an analog reference signal for a digital input signal is used in place of a usual DAC, whereby the first amplitude information adjustment section 103 is deleted, the signal D8 corresponding to first coefficient information (coeff 1) output from the first coefficient selection section 104 is input as a reference signal of the MDAC through the signal input terminal T8, a digital signal output from an amplitude information correction section 8 is input, and the multiplication function of the MDAC is used. A separate DAC may be placed between the amplitude information correction section 8 and the MDAC.

As described above, according to the fourth embodiment of the invention, the MDAC 2402 is used in place of the first amplitude information adjustment section 103, whereby highly accurate distortion compensation processing can be realized according to the simple circuit configuration.

The polar modulation transmitter 2400 according to the fourth embodiment of the invention can be implemented as an integrated circuit as it is formed on a silicon semiconductor substrate, for example. In this case, it is also possible to form the polar modulation transmitter with the function blocks each for each substrate.

Fifth Embodiment

Figure 25:
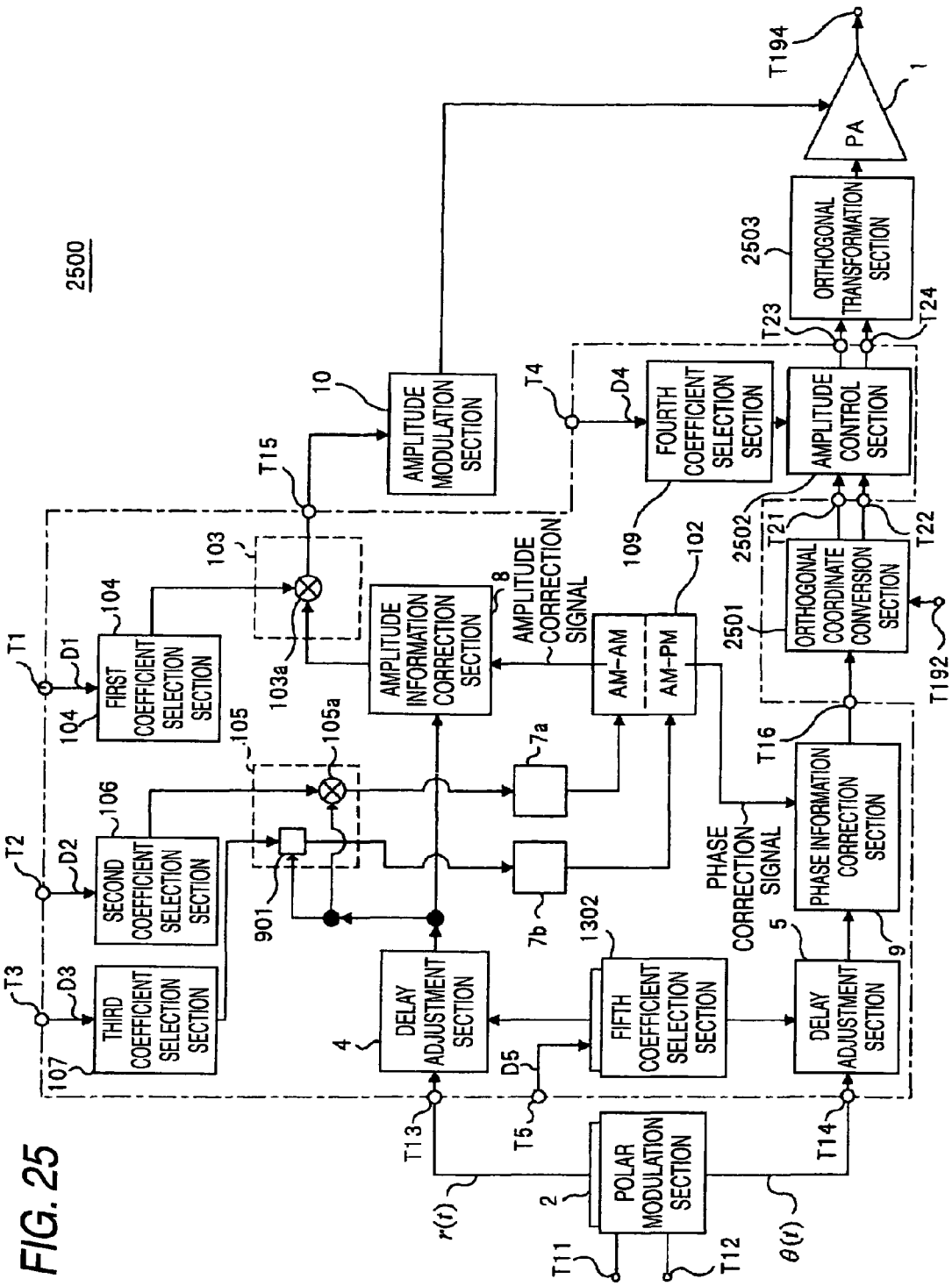
FIG. 25 is a diagram to show another example of the polar modulation transmitter in the first to fourth embodiments of the invention.

FIG. 25 is a block diagram to show another example of the schematic configuration of the polar modulation transmitter according to the first to fourth embodiments of the invention. As shown in FIG. 25, a polar modulation transmitter 2500 includes an orthogonal coordinate conversion section 2501 and an orthogonal transformation section 2503 in place of the phase modulation section 11.

The orthogonal coordinate conversion section 2501 combines a control signal input from a signal input terminal T192 and phase information output from the phase information correction section 9 and outputs an IQ signal. As the control signal input from the signal input terminal T192, the transmission level information of the power amplifier 1 contained in the control signal D191 output from the control section 1903, the amplitude information r(t) output from the polar modulation section 2, etc., can be named.

The orthogonal transformation section 2503 executes orthogonal transformation based on the IQ signal output from the orthogonal coordinate conversion section 2501. A high frequency signal resulting from performing the orthogonal transformation by the orthogonal transformation section 2503 becomes an input signal to the power amplifier 4. If the control signal input from the signal input terminal T192 is the transmission level information of the power amplifier 1 contained in the control signal D191 output from the control section 1903, the high frequency signal input to the power amplifier 4 is a constant amplitude; if the control signal input from the signal input terminal T192 is the amplitude information r(t) output from the polar modulation section 2, the high frequency signal input to the power amplifier 4 involves amplitude fluctuation. The IQ signal input part of the orthogonal transformation section 2503 may be provided with an attenuation circuit so that orthogonal transformation means 6 is not saturated.

Further, as shown in FIG. 25, an amplitude control section 2502 for adjusting the amplitude output from the orthogonal coordinate conversion section 2501 in response to the coefficient information output from the fourth coefficient selection section 109 may be provided between the orthogonal coordinate conversion section 2501 and the orthogonal transformation section 2503 in place of the variable attenuation circuit 108 in FIG. 2. The amplitude control section 2502 has an equal function to that of the variable attenuation circuit 108 and adjusts the amplitude of the high frequency signal input to the power amplifier 1.

Figure 26:
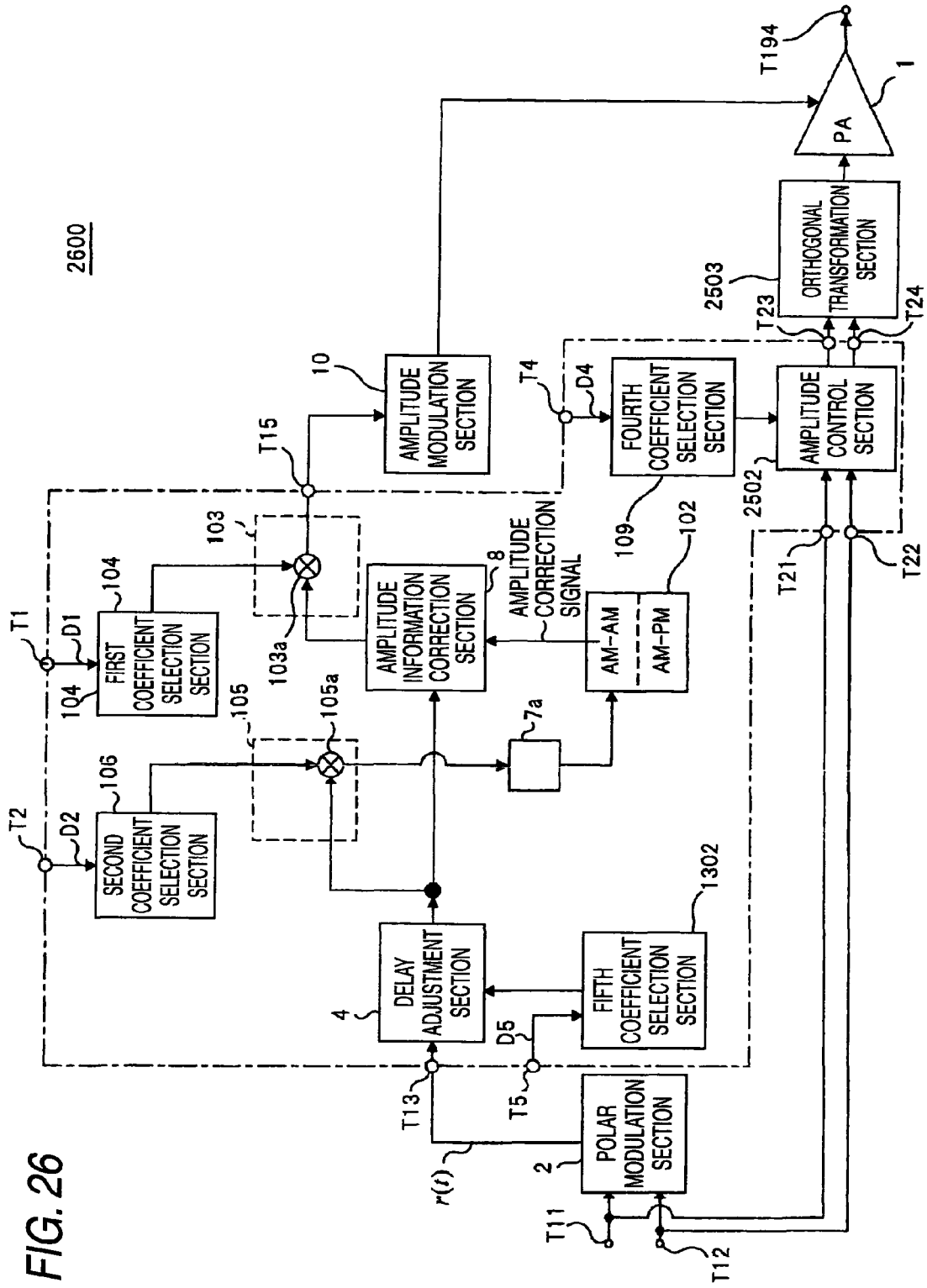
FIG. 26 is a diagram to show another example of the polar modulation transmitter in the first to fourth embodiments of the invention.

FIG. 26 is a block diagram to show another example of the schematic configuration of the polar modulation transmitter according to the first to fourth embodiments of the invention. In the polar modulation circuit in this example, the delay adjustment section 5, the phase information correction section 9, and the orthogonal coordinate conversion section 2501 are deleted from the polar modulation transmitter 2500 in FIG. 25 and the input IQ signal to the orthogonal transformation section 2503 is changed to the IQ signal (I(t), Q(t)) input from the signal generation section 1902, whereby a phase correction to a phase signal is skipped.

As shown in FIG. 26, the amplitude control section 2502 may be provided for adjusting the amplitude for the input IQ signal to the orthogonal transformation section 2503, thereby adjusting the amplitude of the high frequency signal input to the power amplifier 1.

While the invention has been described in detail with reference to the specific embodiments, it will be obvious to those skilled in the art that various changes and modifications can be made without departing from the spirit and the scope of the invention.

This application is based on Japanese Patent Application (No. 2005-375486) filed on Dec. 27, 2005, which is incorporated herein by reference.

INDUSTRIAL APPLICABILITY

The polar modulation transmitter and the polar modulation transmission method of the invention have the advantage that it is made possible to realize low distortion characteristic of the power amplifier at the amplitude modulation operation time while suppressing an increase in the distortion compensation processing data capacity and an increase in the circuit scale of the distortion compensation processing circuit and have the advantage that it is made possible to perform adaptive distortion compensation processing without the need for a synchronization adjustment circuit for synchronizing the input baseband signal and the output signal of the power amplifier.

The invention claimed is:

1. A polar modulation transmitter comprising:
   a polar modulation section that generates an amplitude signal from a baseband orthogonal signal generated based on transmission data;
   an amplitude modulation section that generates an amplitude modulation signal based on the amplitude signal;
   a phase modulation section that generates a phase modulation signal in a wireless frequency band based on a signal having at least a phase component of the baseband orthogonal signal;
   an amplifier that generates transmission data in the wireless frequency band by inputting the phase modulation signal as an input high frequency signal and inputting the amplitude modulation signal as a control signal;
   a detection section that calculates out of band power in two frequency bands of predetermined same detuning frequencies from the center frequency of the output signal of the amplifier; and
   a distortion compensation processing section that includes:
      a predistortion compensation section which stores distortion compensation processing data and executes predetermined distortion compensation processing based on the distortion compensation processing data for at least one of an input signal to the amplitude modulation section and an input signal to the phase modulation section using the amplitude signal as a reference signal: and
      a distortion compensation adjustment section which compensates a transient response characteristic of the output signal from the amplifier at the control voltage driving time based on the control signal, by executing a distortion adjustment to a signal output from the predistortion compensation section or the reference signal based on output of the detection section,
   wherein the predistortion distortion compensation section has a steady characteristic compensation circuit for linearizing the output signal of said amplifier in a steady state based on the output signal characteristic for a control voltage value in the steady state after a predetermined control voltage is input when a predetermined input high frequency signal amplitude is input.

2. The polar modulation transmitter according to claim 1, wherein the predistortion compensation section further includes a delay adjustment section which applies a predetermined delay amount to at least one of the amplitude signal and the signal having the phase component to ensure synchronization between the amplitude signal and the signal having the phase component; and
   wherein the distortion compensation processing section executes distortion adjustment in at least one of the distortion compensation adjustment section and the delay adjustment section based on the output of the detection section.

3. The polar modulation transmitter according to claim 1, wherein the distortion compensation adjustment section controls the adjustment amount for the distortion compensation processing based on plus or minus of the difference between the relative difference of the out of band power and a predetermined threshold value.

4. The polar modulation transmitter according to claim 3, further comprising:
a distortion compensation adjustment determination section that switches between execution and non-execution of the adjustment of the distortion compensation adjustment section.

5. The polar modulation transmitter according to claim 3, wherein the distortion compensation adjustment section has a first amplitude information adjustment section for adjusting the amplitude of the amplitude signal after execution of distortion compensation processing in the steady state characteristic compensation circuit.

6. The polar modulation transmitter according to claim 5, wherein the first amplitude information adjustment section has a multiplication circuit for multiplying the amplitude of the amplitude signal after execution of the distortion compensation processing in the steady state characteristic compensation circuit by a predetermined coefficient.

7. The polar modulation transmitter according to claim 3, wherein the distortion compensation adjustment section has a second amplitude information adjustment section for adjusting the value of a reference address signal when the steady state characteristic compensation circuit executes distortion compensation processing of the amplitude signal.

8. The polar modulation transmitter according to claim 7, wherein the second amplitude information adjustment section has a multiplication circuit for multiplying the value of the reference address signal when the steady state characteristic compensation circuit executes distortion compensation processing of the amplitude signal by a predetermined coefficient.

9. The polar modulation transmitter according to claim 3, wherein the polar modulation section generates a phase signal from the baseband orthogonal signal and outputs the phase signal to the distortion compensation processing section;
wherein the predistortion compensation section performs distortion compensation processing for the phase signal and outputs the signal to the phase modulation section; and
wherein the distortion compensation adjustment section has a second amplitude information adjustment section for adjusting the value of a reference address signal when the steady state characteristic compensation circuit executes distortion compensation processing of the phase signal.

10. The polar modulation transmitter according to claim 9, wherein the second amplitude information adjustment section has a multiplication circuit for multiplying the value of the reference address signal when the steady state characteristic compensation circuit executes distortion compensation processing of the phase signal by a predetermined coefficient.

11. The polar modulation transmitter according to claim 3, wherein the predistortion compensation section has a steady state characteristic compensation circuit for linearizing the output signal of the amplifier in a steady state based on the output signal characteristic for a control voltage value in the steady state after a predetermined control voltage is input when a predetermined input high frequency signal amplitude is input; and
wherein the distortion compensation adjustment section has a phase compensation circuit for adjusting the amplitude of the signal having a phase component and adjusting the input high frequency signal amplitude to the amplifier.

12. The polar modulation transmitter according to claim 11, wherein the phase compensation circuit has a variable attenuation circuit or a variable gain amplifier provided between the phase modulation section and the amplifier.

13. An adaptive distortion compensation processing system, comprising:
a mobile station wireless communication apparatus having a distortion compensation processing circuit; and
a base station wireless communication apparatus,
wherein the base station wireless communication apparatus includes:
a first antenna;
a base station transceiver which transmits and receives data to and from the mobile station wireless communication apparatus through the first antenna;
a detection section that branches a signal output from the first antenna at the reception operation time of the base station wireless communication apparatus and calculates out of band power in two frequency bands of predetermined same detuning frequencies from the center frequency of the branch signal; and
a conversion section which converts relative difference information of the out of band power into transmission data from the base station transceiver to control compensation data relevant to a transmitter of the mobile station wireless communication apparatus.

14. The adaptive distortion compensation processing system according to claim 13, wherein the mobile station wireless communication apparatus includes:
a polar modulation transmitter having:
a polar modulation section which generates an amplitude signal from a baseband orthogonal signal generated based on transmission data;
an amplitude modulation section which generates an amplitude modulation signal based on the amplitude signal;
a phase modulation section which generates a phase modulation signal in a wireless frequency band based on a signal having at least a phase component of the baseband orthogonal signal; and
a distortion compensation processing section which has:
an amplifier for generating transmission data in the wireless frequency band by inputting the phase modulation signal as an input high frequency signal and inputting the amplitude modulation signal as a control signal;
a predistortion compensation section for storing predetermined distortion compensation processing data and performing predetermined distortion compensation processing based on the distortion compensation processing data for at least one of an input signal to the amplitude modulation section and an input signal to the phase modulation section using the amplitude signal as a reference signal; and
a distortion compensation adjustment section for performing a distortion adjustment to a signal output from the predistortion compensation section or the reference signal; and
a second antenna,
wherein the distortion compensation adjustment section reconstructs the relative difference information of the out of band power converted into the transmission signal by the conversion section from a reception signal from the second antenna and executes the distortion adjustment based on the relative difference information.

15. The adaptive distortion compensation processing system according to claim 13, wherein in the mobile station wireless communication apparatus, the predistortion compensation section further includes a delay adjustment section for giving a predetermined delay amount to at least one of the amplitude signal and the signal having a phase component and ensuring synchronization between the amplitude signal and the signal having a phase component; and wherein the distortion compensation adjustment section reconstructs the relative difference information of the out of band power converted into the transmission signal by the conversion section from a reception signal from the second antenna and executes the adjustment in at least one of the distortion compensation adjustment section and the delay adjustment section based on the relative difference information.

16. The adaptive distortion compensation processing system according to claim 13, wherein the conversion section converts the relative difference information into code information and absolute value information converted into a discrete value at a predetermined interval.

17. The adaptive distortion compensation processing system according to claim 14, further comprising:

a distortion compensation adjustment determination section that switches between execution and non-execution of the adjustment of the distortion compensation adjustment section based on plus or minus of the difference between the relative difference information and a predetermined threshold value.

18. The adaptive distortion compensation processing system according to claim 14, wherein the predistortion compensation section has a steady state characteristic compensation circuit for linearizing the output signal of the amplifier in a steady state based on the output signal characteristic for a control voltage value in the steady state after a predetermined control voltage is input when a predetermined input high frequency signal amplitude is input; and wherein the distortion compensation adjustment section has a first amplitude information adjustment section for adjusting the amplitude of the amplitude signal after execution of distortion compensation processing in the steady state characteristic compensation circuit and compensating for a transient response characteristic of the output signal from the amplifier at the control voltage driving time.

19. The adaptive distortion compensation processing system according to claim 18, wherein the first amplitude information adjustment section has a multiplication circuit for multiplying the amplitude of the amplitude signal after execution of the distortion compensation processing in the steady state characteristic compensation circuit by a predetermined coefficient.

20. The adaptive distortion compensation processing system according to claim 14, wherein the predistortion compensation section has a steady state characteristic compensation circuit for linearizing the output signal of the amplifier in a steady state based on the output signal characteristic for a control voltage value in the steady state after a predetermined control voltage is input when a predetermined input high frequency signal amplitude is input; and wherein the distortion compensation adjustment section has a second amplitude information adjustment section for adjusting the value of a reference address signal when the steady state characteristic compensation circuit executes distortion compensation processing of the amplitude signal and compensating for a transient response characteristic of the output signal from the amplifier at the control voltage driving time.

21. The adaptive distortion compensation processing system according to claim 20, wherein the second amplitude information adjustment section has a multiplication circuit for multiplying the value of the reference address signal when the steady state characteristic compensation circuit executes distortion compensation processing of the amplitude signal by a predetermined coefficient.

22. The adaptive distortion compensation processing system according to claim 14, wherein the polar modulation section generates a phase signal from the baseband orthogonal signal and outputs the phase signal to the distortion compensation processing section;

wherein the distortion compensation processing section performs distortion compensation processing for the phase signal and outputs the signal to the phase modulation section;

wherein the predistortion compensation section has a steady state characteristic compensation circuit for linearizing the output signal of the amplifier in a steady state based on the output signal characteristic for a control voltage value in the steady state after a predetermined control voltage is input when a predetermined input high frequency signal amplitude is input; and wherein the distortion compensation adjustment section has a second amplitude information adjustment section for adjusting the value of a reference address signal when the steady state characteristic compensation circuit executes distortion compensation processing of the phase signal and compensating for a transient response characteristic of the output signal from the amplifier at the control voltage driving time.

23. The adaptive distortion compensation processing system according to claim 22, wherein the second amplitude information adjustment section has a multiplication circuit for multiplying the value of the reference address signal when the steady state characteristic compensation circuit executes distortion compensation processing of the phase signal by a predetermined coefficient.

24. The adaptive distortion compensation processing system according to claim 14, wherein the predistortion compensation section has a steady state characteristic compensation circuit for linearizing the output signal of the amplifier in a steady state based on the output signal characteristic for a control voltage value in the steady state after a predetermined control voltage is input when a predetermined input high frequency signal amplitude is input; and wherein the distortion compensation adjustment section has a phase compensation circuit for adjusting the amplitude of the signal having a phase component and adjusting the input high frequency signal amplitude to the amplifier.

25. The adaptive distortion compensation processing system according to claim 24, wherein the phase compensation circuit has a variable attenuation circuit or a variable gain amplifier provided between the phase modulation section and the amplifier.

26. A polar modulation transmitter, comprising:

a polar modulation section that generates an amplitude signal from a baseband orthogonal signal generated based on transmission data;

an amplitude modulation section that generates an amplitude modulation signal based on the amplitude signal;

a phase modulation section that generates a phase modulation signal in a wireless frequency band based on a signal having at least a phase component of the baseband orthogonal signal;

an amplifier that generates transmission data in the wireless frequency band by inputting the phase modulation signal as an input high frequency signal and inputting the amplitude modulation signal as a control signal; and a distortion compensation processing section that includes a predistortion compensation section which stores predetermined distortion compensation processing data to perform predetermined distortion compensation processing based on the distortion compensation processing data for at least one of an input signal to the amplitude modulation section and an input signal to the phase modulation section using the amplitude signal as a reference signal and a distortion compensation adjustment section for compensates a transient response characteristic of the output signal from the amplifier at the control voltage driving time based on the control signal by executing a distortion adjustment to a signal output from the predistortion compensation section or the reference signal based on modulation, wherein the predistortion distortion compensation section has a steady characteristic compensation circuit for linearizing the output signal of said amplifier in a steady state based on the output signal characteristic for a control voltage value in the steady state after a predetermined control voltage is input when a predetermined input high frequency signal amplitude is input.

27. A polar modulation transmitter, comprising:

a polar modulation section that generates an amplitude signal from a baseband orthogonal signal generated based on transmission data;

an amplitude modulation section that generates an amplitude modulation signal based on the amplitude signal;

a phase modulation section that generates a phase modulation signal in a wireless frequency band based on a signal having at least a phase component of the baseband orthogonal signal;

an amplifier that generates transmission data in the wireless frequency band by inputting the phase modulation signal as an input high frequency signal and inputting the amplitude modulation signal as a control signal; and a distortion compensation processing section that includes a predistortion compensation section which stores predetermined distortion compensation processing data to perform predetermined distortion compensation processing based on the distortion compensation processing data for at least one of an input signal to the amplitude modulation section and an input signal to the phase modulation section using the amplitude signal as a reference signal and a distortion compensation adjustment section for executing a distortion adjustment to a signal output from the predistortion compensation section or the reference signal, wherein the predistortion compensation section has a steady state characteristic compensation circuit for linearizing the output signal of the amplifier in a steady state based on the output signal characteristic for a control voltage value in the steady state after a predetermined control voltage is input when a predetermined input high frequency signal amplitude is input;

wherein the distortion compensation adjustment section has a first amplitude information adjustment section for adjusting the amplitude of the amplitude signal after execution of distortion compensation processing in the steady state characteristic compensation circuit and compensating for a transient response characteristic of the output signal from the amplifier at the control voltage driving time; and wherein the first amplitude information adjustment section is a multiplying digital-analog conversion circuit.

28. The polar modulation transmitter according to claim 27, wherein the distortion compensation adjustment section adjusts a reference potential of the multiplying digital-analog conversion circuit in response to an environmental temperature.

29. The polar modulation transmitter according to claim 27, further comprising:

a detection section that calculates out of band power in two frequency bands of predetermined same detuning frequencies from the center frequency of the output signal of the amplifier.

30. The polar modulation transmitter according to claim 29, wherein the distortion compensation adjustment section adjusts the reference potential of the multiplying digital-analog conversion circuit based on plus or minus of the difference between the relative difference of the out of band power and a predetermined threshold value.

31. The polar modulation transmitter according to claim 30, further comprising:

a distortion compensation adjustment determination section that switches between execution and non-execution of the adjustment of the reference potential of the multiplying digital-analog conversion circuit in the distortion compensation adjustment section.

32. A polar modulation transmission method comprising:

generating an amplitude signal from a baseband orthogonal signal generated based on transmission data;

generating an amplitude modulation signal based on the amplitude signal by an amplitude modulation section;

generating a phase modulation signal in a wireless frequency band based on a signal having at least a phase component of the baseband orthogonal signal by a phase modulation section;

generating transmission data in the wireless frequency band by an amplifier by inputting the phase modulation signal as an input high frequency signal and inputting the amplitude modulation signal as a control signal;

calculating out of band power in two frequency bands of predetermined same detuning frequencies from the center frequency of the output signal of the amplifier by a detection section;

performing predetermined distortion compensation processing by a predistortion compensation section storing predetermined distortion compensation processing data based on the distortion compensation processing data for at least one of an input signal to the amplitude modulation section and an input signal to the phase modulation section using the amplitude signal as a reference signal; and compensating a transient response characteristic of the output signal from the amplifier at the control voltage driving time based on the control signal by executing a distortion adjustment to a signal output from the predistortion compensation section or the reference signal based on output of the detection section, wherein the predistortion distortion compensation section has a steady characteristic compensation circuit for linearizing the output signal of said amplifier in a steady state based on the output signal characteristic for a control voltage value in the steady state after a predetermined control voltage is input when a predetermined input high frequency signal amplitude is input.

33. An adaptive distortion compensation processing method of an adaptive distortion compensation processing system including a mobile station wireless communication apparatus having a distortion compensation processing circuit and a base station wireless communication apparatus, the adaptive distortion compensation processing method comprising:
- transmitting and receiving data in the base station wireless communication apparatus to and from the mobile station wireless communication apparatus;
- branching a signal output from the first antenna at the reception operation time of the base station wireless communication apparatus and calculating out of band power in two frequency bands of predetermined same detuning frequencies from the center frequency of the branch signal; and
- converting relative difference information of the out of band power into transmission data from the base station transceiver to control compensation data relevant to a transmitter of the mobile station wireless communication apparatus.

34. A polar modulation transmission method comprising:
- generating an amplitude signal from a baseband orthogonal signal generated based on transmission data;
- generating an amplitude modulation signal based on the amplitude signal by an amplitude modulation section;
- generating a phase modulation signal in a wireless frequency band based on a signal having at least a phase component of the baseband orthogonal signal by a phase modulation section;
- generating transmission data in the wireless frequency band by an amplifier by inputting the phase modulation signal as an input high frequency signal and inputting the amplitude modulation signal as a control signal;
- performing predetermined distortion compensation processing by a predistortion compensation section storing predetermined distortion compensation processing data based on the distortion compensation processing data for at least one of an input signal to the amplitude modulation section and an input signal to the phase modulation section using the amplitude signal as a reference signal; and
- compensating a transient response characteristic of the output signal from the amplifier at the control voltage driving time based on the control signal by executing a distortion adjustment to a signal output from the predistortion compensation section or the reference signal based on modulation speed, wherein the predistortion distortion compensation section has a steady characteristic compensation circuit for linearizing the output signal of said amplifier in a steady state based on the output signal characteristic for a control voltage value in the steady state after a predetermined control voltage is input when a predetermined input high frequency signal amplitude is input.

35. A polar modulation transmission method comprising:
- generating an amplitude signal from a baseband orthogonal signal generated based on transmission data;
- generating an amplitude modulation signal based on the amplitude signal by an amplitude modulation section;
- generating a phase modulation signal in a wireless frequency band based on a signal having at least a phase component of the baseband orthogonal signal by a phase modulation section;
- generating transmission data in the wireless frequency band by an amplifier by inputting the phase modulation signal as an input high frequency signal and inputting the amplitude modulation signal as a control signal;
- performing predetermined distortion compensation processing by a predistortion compensation section storing predetermined distortion compensation processing data based on the distortion compensation processing data for at least one of an input signal to the amplitude modulation section and an input signal to the phase modulation section using the amplitude signal as a reference signal; and
- executing a distortion adjustment to a signal output from the predistortion compensation section or the reference signal by the distortion compensation adjustment section, wherein the process of performing the distortion compensation processing by the predistortion compensation section has a process of linearizing the output signal of the amplifier in a steady state by a steady state characteristic compensation circuit based on the output signal characteristic for a control voltage value in the steady state after a predetermined control voltage is input when a predetermined input high frequency signal amplitude is input; and wherein the process of executing the adjustment by the distortion compensation adjustment section has a process of adjusting the amplitude of the amplitude signal after execution of distortion compensation processing in the steady state characteristic compensation circuit and compensating for a transient response characteristic of the output signal from the amplifier at the control voltage driving time by a multiplying digital-analog conversion circuit.

* * * * *